United States Patent
Kim

(10) Patent No.: US 9,653,157 B1
(45) Date of Patent: May 16, 2017

(54) MEMORY SYSTEM AND OPERATING METHOD THEREOF

(71) Applicant: SK hynix Inc., Gyeonggi-do (KR)

(72) Inventor: Ki-Sung Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/153,432

(22) Filed: May 12, 2016

(30) Foreign Application Priority Data

Dec. 2, 2015 (KR) .................. 10-2015-0170865

(51) Int. Cl.
*G11C 7/00* (2006.01)
*G11C 11/56* (2006.01)
*G11C 16/04* (2006.01)
*G11C 16/26* (2006.01)

(52) U.S. Cl.
CPC ...... *G11C 11/5642* (2013.01); *G11C 16/0483* (2013.01); *G11C 16/26* (2013.01)

(58) Field of Classification Search
CPC .............. G11C 29/00; G11C 8/08; G11C 8/14
USPC .................................. 365/200, 201, 185.22
See application file for complete search history.

(56) References Cited

U.S. PATENT DOCUMENTS

| 2002/0039311 A1* | 4/2002 | Takeuchi ............... G11C 16/20 365/185.09 |
| 2008/0239851 A1* | 10/2008 | Lin ..................... G11C 16/3418 365/222 |
| 2013/0070526 A1* | 3/2013 | Eun ........................ G11C 16/26 365/185.03 |

FOREIGN PATENT DOCUMENTS

| KR | 1020130084901 | 7/2013 |
| KR | 1020140112968 | 9/2014 |
| KR | 1020150020902 | 2/2015 |

* cited by examiner

*Primary Examiner* — Han Yang
(74) *Attorney, Agent, or Firm* — IP & T Group LLP

(57) ABSTRACT

A memory system includes a memory device including a plurality of memory blocks, each memory block including a plurality of word lines, each word line being coupled to a plurality of memory cells, and a controller suitable for grouping the word lines into a plurality of word line groups, wherein when receiving a read command for data stored in a first memory block, the controller performs a read operation for word lines of the first memory block, checks for read fail word lines in the word lines of the first memory block, checks for word line groups including the read fail word lines, and transmits a set command corresponding to the read fail word lines to the word line groups which contain read fail word lines.

16 Claims, 13 Drawing Sheets

MEMORY SYSTEM AND OPERATING METHOD THEREOF

CROSS-REFERENCE TO RELATED APPLICATION

The present application claims priority of Korean Patent Application No. 10-2015-0170865, filed on Dec. 2, 2015, the disclosure of which is incorporated herein in its entirety by reference.

TECHNICAL FIELD

Exemplary embodiments relate to a memory system and, more particularly, to a memory system for processing data to a memory device and an operating method thereof.

DISCUSSION OF THE RELATED ART

The computer environment paradigm has shifted to ubiquitous computing systems that can be used anytime and anywhere. As a result, use of portable electronic devices such as mobile phones, digital cameras, and notebook computers continues to increase rapidly. These portable electronic devices generally use a memory system having one or more semiconductor memory devices for storing data. The semiconductor memory devices also referred to as data storage devices may be used as the main memory device or an auxiliary memory device of a portable electronic device.

Semiconductor memory devices provide excellent stability, durability, high information access speed, and low power consumption, since unlike other type of storage devices they have no moving parts. Examples of semiconductor memory devices having such advantages include universal serial bus (USB) memory devices, memory cards having various interfaces, and solid state drives (SSD).

SUMMARY

Various embodiments of the present disclosure are directed to a memory system capable of minimizing complexity and performance deterioration thereof and rapidly and reliably processing data to and or from a memory device and an operating method thereof.

In an embodiment of the present disclosure, a memory system may include: a memory device including a plurality of memory blocks, each memory block including a plurality of word lines, each word line being coupled to a plurality of memory cells; and a controller suitable for grouping the word lines into a plurality of word line groups. When receiving a read command for data stored in a first memory block, the controller may perform a read operation for word lines of the first memory block, may check for read fail word lines in the word lines of the first memory block, may check for word line groups including the read fall word lines, and may transmit a set command corresponding to the read fall word lines to the word line groups which contain read fail word lines.

The set command may include: first information indicating a first register corresponding to a first word line group in which a first read fail word line of the read fail word lines is included; and second information indicating a second register corresponding to a second word line group in which a second read fall word line of the read fall word lines is included.

A read voltage level of the first word line group may be changed to a first level through the first register depending on a level value included in the set command. A read voltage level of the second word line group may be changed to a second level through the second register depending on the level value included in the set command. A first read retry voltage having the first level may be applied to the first word line group. A second read retry voltage having the second level may be applied to the second word line group.

The controller may determine each of the first level and the second level. The level value may be determined corresponding to the first level and the second level each of which is determined by the controller.

The level value may be determined by an offset for the read voltage level of the first word line group and the read voltage level of the second word line group, or by a table value from a read retry table (RRT) corresponding to the first word line group and the second word line group.

The controller may perform, through the first read retry voltage applied to the first word line group and the second read retry voltage applied to the second word line group, a read retry operation for the first read fall word line and the second read fall word line.

The set command may include information indicating a register corresponding to the word line groups of the first memory block.

A read voltage level for the word line groups of the first memory block may be successively changed to a plurality of levels through the register depending on an offset or a read retry table (RRT) value that is included in the set command. Read retry voltages having the plurality of levels may be applied to the word line groups of the first memory block.

The set command may include indication information on the word line groups including the read fail word lines. Corresponding to the indication information, a read voltage level of the word line groups including the read fail word lines may be changed to the plurality of levels through the register.

The word line groups of the first memory block may be included in word line groups of a second memory block of the memory blocks.

In an embodiment of the present disclosure, a method of operating a memory system comprising a memory device with a plurality of memory blocks, may include: grouping a plurality of word lines included in the plurality of memory blocks, and dividing each of the memory blocks into a plurality of word line groups, wherein each of the memory blocks includes a plurality of pages each including a plurality of memory cells coupled to respective word lines; receiving a read command for data stored in a first memory block of the memory blocks; performing a read operation for word lines of the first memory block; checking read fail word lines in the word lines of the first memory block, and checking, in word line groups of the first memory block, word line groups including the read fail word lines; and transmitting a set command corresponding to the read fail word lines to the first memory block.

The set command may include: first information indicating a first register corresponding to a first word line group in which a first read fail word line of the read fail word lines is included; and second information indicating a second register corresponding to a second word line group in which a second read fail word line of the read fail word lines is included.

The method may further include: changing a read voltage level of the first word line group to a first level through the first register depending on a level value included in the set command; changing a read voltage level of the second word line group to a second level through the second register depending on the level value included in the set command; applying a first read retry voltage having the first level to the first word line group; and applying a second read retry voltage having the second level to the second word line group.

Each of the first level and the second level may be determined by a controller of the memory device, and the level value may be determined corresponding to the first level and the second level each of which is determined by the controller.

The level value may be determined by an offset for the read voltage level of the first word line group and the read voltage level of the second word line group, or by a table value from a read retry table (RRT) corresponding to the first word line group and the second word line group.

The method may further include: performing, through the first read retry voltage applied to the first word line group and the second read retry voltage applied to the second word line group, a read retry operation for the first read fail word line and the second read fail word line.

The set command may include information indicating a register corresponding to the word line groups of the first memory block.

The method may further include: successively changing a read voltage level for the word line groups of the first memory block to a plurality of levels through the register depending on an offset or a read retry table (RRT) value that is included in the set command; and applying read retry voltages having the plurality of levels to the word line groups of the first memory block.

The successively changing may include: changing, when indication information on the word line groups including the read fail word lines is included in the set command, corresponding to the indication information, a read voltage level of the word line groups including the read fail word lines to the plurality of levels through the register.

The word line groups of the first memory block may be included in word line groups of a second memory block of the memory blocks.

DETAILED DESCRIPTION

Figure 1:
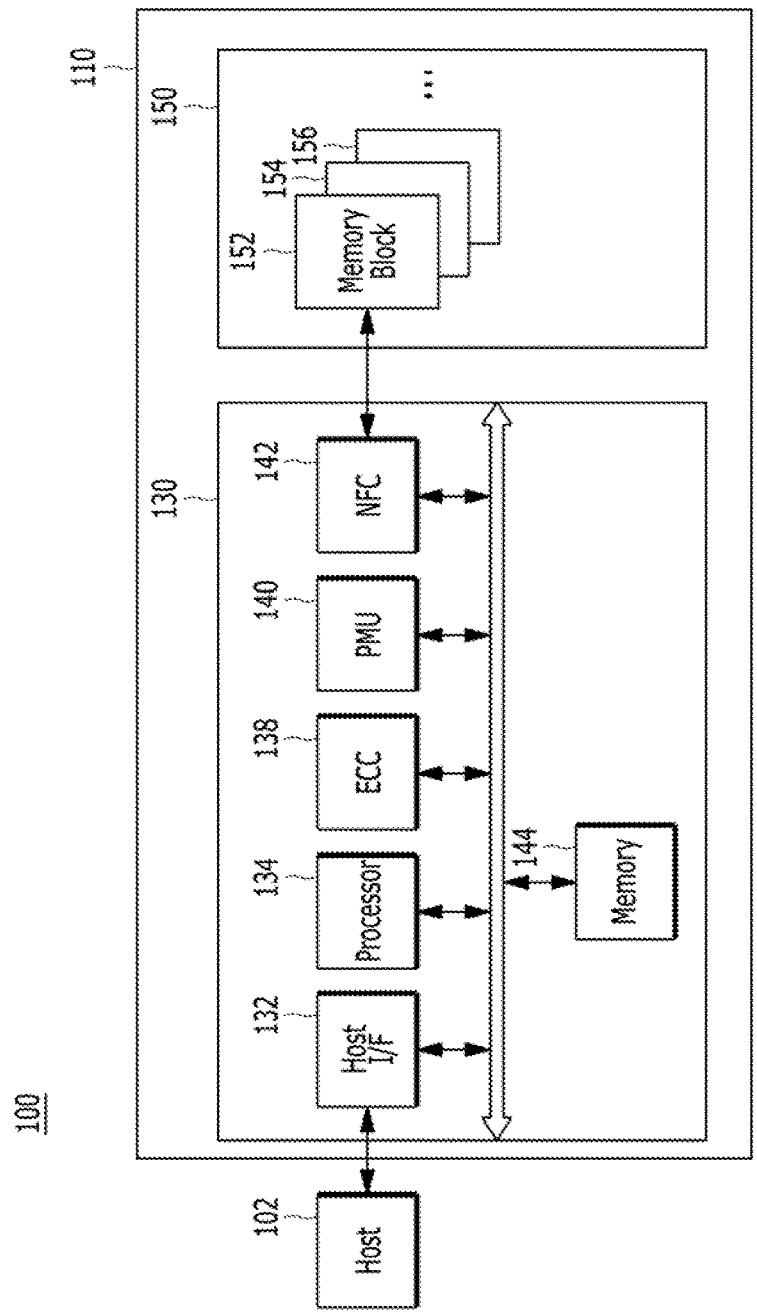
FIG. 1 is a diagram illustrating a data processing system including a host and memory system, according to an embodiment of the invention.

Various embodiments of the invention will be described with reference to the accompanying drawings. It is noted, however, that the present invention may be embodied in different forms and should not be construed as being limited to the embodiments set forth herein. Rather, these embodiments are provided so that this disclosure is thorough and complete. Throughout the disclosure, like reference numerals are used to refer to like parts in the various figures and embodiments of the present invention.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via an intervening element therebetween. Furthermore, the terms "comprises," "includes, or "has" when used in this disclosure should be understood as open ended terms allowing the presence of other non-stated elements (or features) in addition to any stated elements. Also terms of singular form may include plural forms unless stated specifically otherwise.

FIG. 1 is a block diagram illustrating a data processing system including a memory system according to an embodiment.

Referring to FIG. 1, a data processing system 100 may include a host 102 and a memory system 110.

The host 102 may include, for example, a portable electronic device such as a mobile phone, an MP3 player and a laptop computer or an electronic device such as a desktop computer, a game player, a TV and a projector.

The memory system 110 may operate in response to a request from the host 102, and in particular, store data to be accessed by the host 102. In other words, the memory system 110 may be used as a main memory system or an auxiliary memory system of the host 102. The memory system 110 may be implemented with any one of various kinds of storage devices, according to the protocol of a host interface to be electrically coupled with the host 102. The memory system 110 may be implemented with any one of various kinds of storage devices such as a solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card, a memory stick, and so forth.

The storage devices for the memory system 110 may be implemented with a volatile memory device such as a dynamic random access memory (DRAM) and a static random access memory (SRAM) or a nonvolatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The memory system 110 may include a memory device 150 which stores data to be accessed by the host 102, and a controller 130 which may control storage of data in the memory device 150.

The controller 130 and the memory device 150 may be integrated into one semiconductor device. For instance, the controller 130 and the memory device 150 may be integrated into one semiconductor device and configure a solid state drive (SSD). When the memory system 110 is used as the SSD, the operation speed of the host 102 that is electrically coupled with the memory system 110 may be significantly increased.

The controller 130 and the memory device 150 may be integrated into one semiconductor device and configure a memory card. The controller 130 and the memory card 150 may be integrated into one semiconductor device and configure a memory card such as a Personal Computer Memory Card International Association (PCMCIA) card, a compact flash (CF) card, a smart media (SM) card (SMC), a memory stick, a multimedia card (MMC), an RS-MMC and a micro-MMC, a secure digital (SD) card, a mini-SD, a micro-SD and an SDHC, and a universal flash storage (UFS) device.

For another instance, the memory system 110 may configure a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a three-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, an RFID device, or one of various component elements configuring a computing system.

The memory device 150 of the memory system 110 may retain stored data when power supply is interrupted and, in particular, store the data provided from the host 102 during a write operation, and provide stored data to the host 102 during a read operation. The memory device 150 may include a plurality of memory blocks 152, 154 and 156. Each of the memory blocks 152, 154 and 156 may include a plurality of pages. Each of the pages may include a plurality of memory cells to which a plurality of word lines (WL) are electrically coupled. The memory device 150 may be a nonvolatile memory device, for example, a flash memory. The flash memory may have a three-dimensional (3D) stack structure. The structure of the memory device 150 and the three-dimensional (3D) stack structure of the memory device 150 will be described later in detail with reference to FIGS. 2 to 11.

The controller 130 of the memory system 110 may control the memory device 150 in response to a request from the host 102. The controller 130 may provide the data read from the memory device 150, to the host 102, and store the data provided from the host 102 into the memory device 150. To this end, the controller 130 may control overall operations of the memory device 150, such as read, write, program and erase operations.

In detail, the controller 130 may include a host interface unit 132, a processor 134, an error correction code (ECC) unit 138, a power management unit 140, a NAND flash controller 142, and a memory 144.

The host interface unit 132 may process commands and data provided from the host 102, and may communicate with the host 102 through at least one of various interface protocols such as universal serial bus (USB), multimedia card (MMC), peripheral component Interconnect-express (PCI-E), serial attached SCSI (SAS), serial advanced technology attachment (SATA), parallel advanced technology attachment (PATA), small computer system interface (SCSI), enhanced small disk interface (ESDI), and integrated drive electronics (IDE).

The ECC unit 138 may detect and correct errors in the data read from the memory device 150 during the read operation. The ECC unit 138 may not correct error bits when the number of the error bits is greater than or equal to a threshold number of correctable error bits, and may output an error correction fail signal indicating failure in correcting the error bits.

The ECC unit 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC unit 138 may include all circuits, systems or devices for the error correction operation.

The PMU 140 may provide and manage power for the controller 130, that is, power for the component elements included in the controller 130.

The NFC 142 may serve as a memory interface between the controller 130 and the memory device 150 to allow the controller 130 to control the memory device 150 in response to a request from the host 102. The NFC 142 may generate control signals for the memory device 150 and process data under the control of the processor 134 when the memory device 150 is a flash memory and, in particular, when the memory device 150 is a NAND flash memory.

The memory 144 may serve as a working memory of the memory system 110 and the controller 130, and store data for driving the memory system 110 and the controller 130. The controller 130 may control the memory device 150 in response to a request from the host 102. For example, the controller 130 may provide the data read from the memory device 150 to the host 102 and store the data provided from the host 102 in the memory device 150. When the controller 130 controls the operations of the memory device 150, the memory 144 may store data used by the controller 130 and the memory device 150 for such operations as read, write, program and erase operations.

The memory 144 may be implemented with a volatile memory. The memory 144 may be implemented with a static random access memory (SRAM) or a dynamic random access memory (DRAM). As described above, the memory 144 may store data used by the host 102 and the memory device 150 for the read and write operations. To store the data, the memory 144 may include a program memory, a data memory, a write buffer, a read buffer, a map buffer, and so forth.

The processor 134 may control general operations of the memory system 110, and a write operation or a read operation for the memory device 150, in response to a write request or a read request from the host 102. The processor 134 may drive firmware, which is referred to as a flash translation layer (FTL), to control the general operations of the memory system 110. The processor 134 may be implemented with a microprocessor or a central processing unit (CPU).

A management unit (not shown) may be included in the processor 134, and may perform bad block management of the memory device 150. The management unit may find bad memory blocks included in the memory device 150, which are in unsatisfactory condition for further use, and perform bad block management on the bad memory blocks. When the memory device 150 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block. Also, the bad blocks due to the program fail seriously deteriorates the utilization efficiency of the memory device 150 having a 3D stack structure and the reliability of the memory system 100, and thus reliable bad block management is required.

Figure 2:
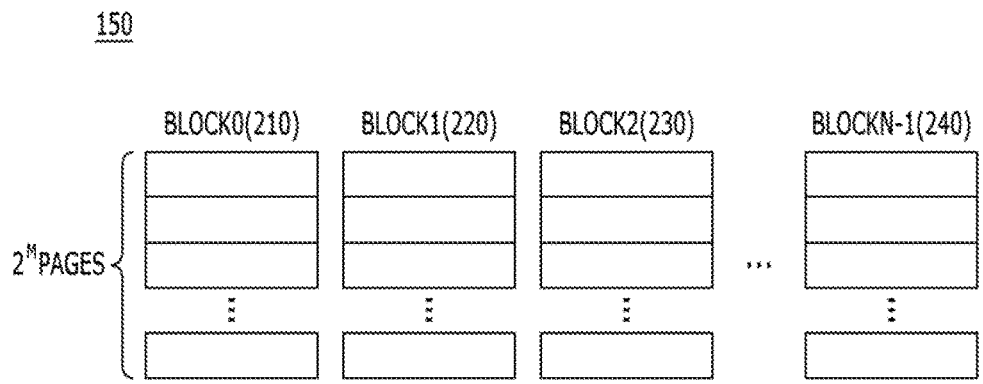
FIG. 2 is a diagram illustrating an example of a memory device employed in the memory system of FIG. 1.

FIG. 2 is a schematic diagram illustrating the memory device 150 shown in FIG. 1.

Referring to FIG. 2, the memory device 150 may include a plurality of memory blocks, for example, zeroth to (N−1)$^{th}$ blocks 210 to 240. Each of the plurality of memory blocks 210 to 240 may include a plurality of pages, for example, $2^M$ number of pages ($2^M$ PAGES), to which the present invention will not be limited. Each of the plurality of pages may include a plurality of memory cells to which a plurality of word lines are electrically coupled.

Also, the memory device 150 may include a plurality of memory blocks, as single level cell (SLC) memory blocks and multi-level cell (MLC) memory blocks, according to the number of bits which may be stored or expressed in each memory cell. The SLC memory block may include a plurality of pages which are implemented with memory cells each capable of storing 1-bit data. The MLC memory block may include a plurality of pages which are implemented with memory cells each capable of storing multi-bit data, for example, two or more-bit data. An MLC memory block including a plurality of pages which are implemented with memory cells that are each capable of storing 3-bit data may be defined as a triple level cell (TLC) memory block.

Each of the plurality of memory blocks 210 to 240 may store the data provided from the host device 102 during a write operation, and may provide stored data to the host 102 during a read operation.

Figure 3:
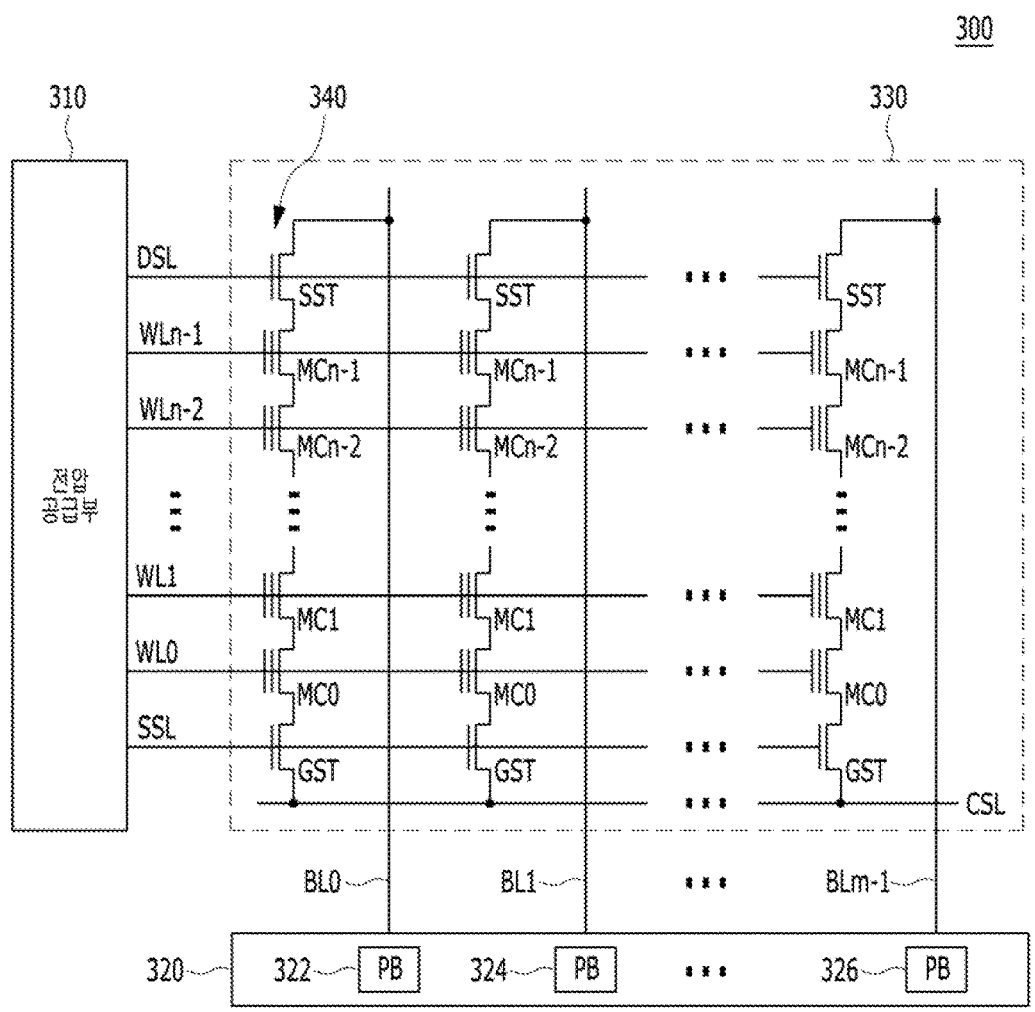
FIG. 3 is a circuit diagram of a memory block of the memory device of FIG. 2, according to an embodiment of the invention.

FIG. 3 is a circuit diagram illustrating one of the plurality of memory blocks 152 to 156 shown in FIG. 1.

Referring to FIG. 3, the memory block 152 of the memory device 150 may include a plurality of cell strings 340 which are electrically coupled to bit lines BL0 to BLm−1, respectively. The cell string 340 of each column may include at least one drain select transistor DST and at least one source select transistor SST. A plurality of memory cells or a plurality of memory cell transistors MC0 to MCn−1 may be electrically coupled in series between the select transistors DST and SST. The respective memory cells MC0 to MCn−1 may be configured by multi-level cells (MLC) each of which stores data information of a plurality of bits. The strings 340 may be electrically coupled to the corresponding bit lines BL0 to BLm−1, respectively. For reference, in FIG. 3, 'DSL' denotes a drain select line, 'SSL' denotes a source select line, and 'CSL' denotes a common source line.

While FIG. 3 shows, as an example, the memory block 152 which is configured by NAND flash memory cells, it is to be noted that the memory block 152 of the memory device 150 according to the embodiment is not limited to NAND flash memory and may be realized by NOR flash memory, hybrid flash memory in which at least two kinds of memory cells are combined, or one-NAND flash memory in which a controller is built in a memory chip. The operational characteristics of a semiconductor device may be applied to not only a flash memory device in which a charge storing layer is configured by conductive floating gates but also a charge trap flash (CTF) in which a charge storing layer is configured by a dielectric layer.

A voltage supply block 310 of the memory device 150 may provide word line voltages, for example, a program voltage, a read voltage and a pass voltage, to be supplied to respective word lines according to an operation mode and voltages to be supplied to bulks, for example, well regions in which the memory cells are formed. The voltage supply block 310 may perform a voltage generating operation under the control of a control circuit (not shown). The voltage supply block 310 may generate a plurality of variable read voltages to generate a plurality of read data, select one of the memory blocks or sectors of a memory cell array under the control of the control circuit, select one of the word lines of the selected memory block, and provide the word line voltages to the selected word line and unselected word lines.

A read/write circuit 320 of the memory device 150 may be controlled by the control circuit, and may serve as a sense amplifier or a write driver according to an operation mode. During a verification/normal read operation, the read/write circuit 320 may serve as a sense amplifier for reading data from the memory cell array. Also, during a program operation, the read/write circuit 320 may serve as a write driver which drives bit lines according to data to be stored in the memory cell array. The read/write circuit 320 may receive data to be written in the memory cell array, from a buffer (not shown), during the program operation, and may drive the bit lines according to the inputted data. To this end, the read/write circuit 320 may include a plurality of page buffers 322, 324 and 326 respectively corresponding to columns (or bit lines) or pairs of columns (or pairs of bit lines), and a plurality of latches (not shown) may be included in each of the page buffers 322, 324 and 326.

FIGS. 4 to 11 are schematic diagrams illustrating the memory device 150 shown in FIG. 1.

Figure 4:
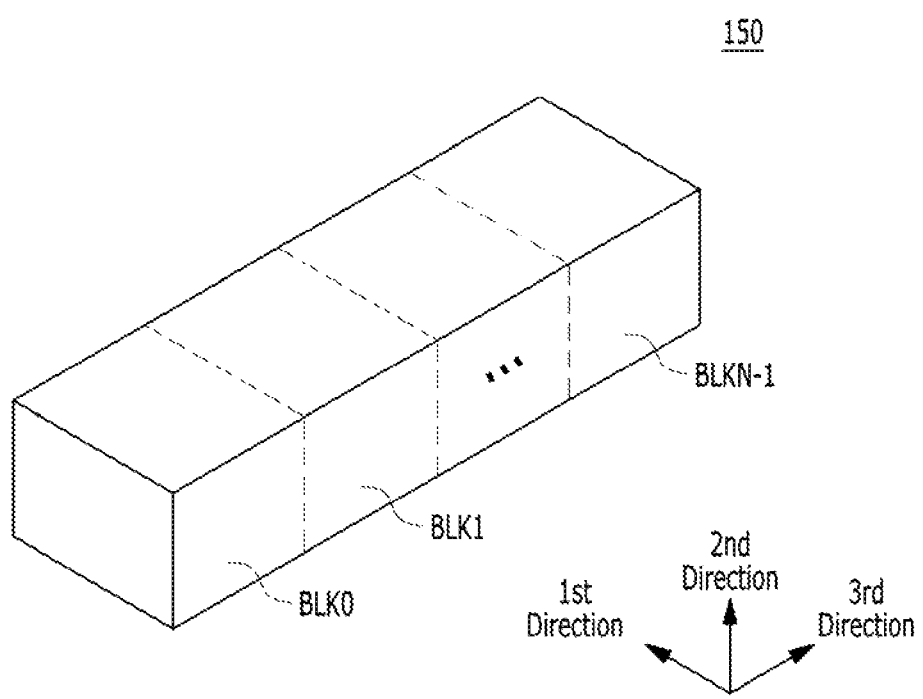
FIGS. 4 to 11 are diagrams schematically illustrating various aspects of the memory device shown in FIG. 2, according to embodiments of the invention.

FIG. 4 is a block diagram illustrating an example of the plurality of memory blocks 152 to 156 of the memory device 150 shown in FIG. 1.

Referring to FIG. 4, the memory device 150 may include a plurality of memory blocks BLK0 to BLKN−1, and each of the memory blocks BLK0 to BLKN−1 may be realized in a three-dimensional (3D) structure or a vertical structure. The respective memory blocks BLK0 to BLKN−1 may include structures which extend in first to third directions, for example, an x-axis direction, a y-axis direction and a z-axis direction.

The respective memory blocks BLK0 to BLKN−1 may include a plurality of NAND strings NS which extend in the second direction. The plurality of NAND strings NS may be provided in the first direction and the third direction. Each NAND string NS may be electrically coupled to a bit line BL, at least one source select line SSL, at least one ground select line GSL, a plurality of word lines WL, at least one dummy word line DWL, and a common source line CSL. Namely, the respective memory blocks BLK0 to BLKN−1 may be electrically coupled to a plurality of bit lines BL, a plurality of source select lines SSL, a plurality of ground select lines GSL, a plurality of word lines WL, a plurality of dummy word lines DWL, and a plurality of common source lines CSL.

Figure 5:
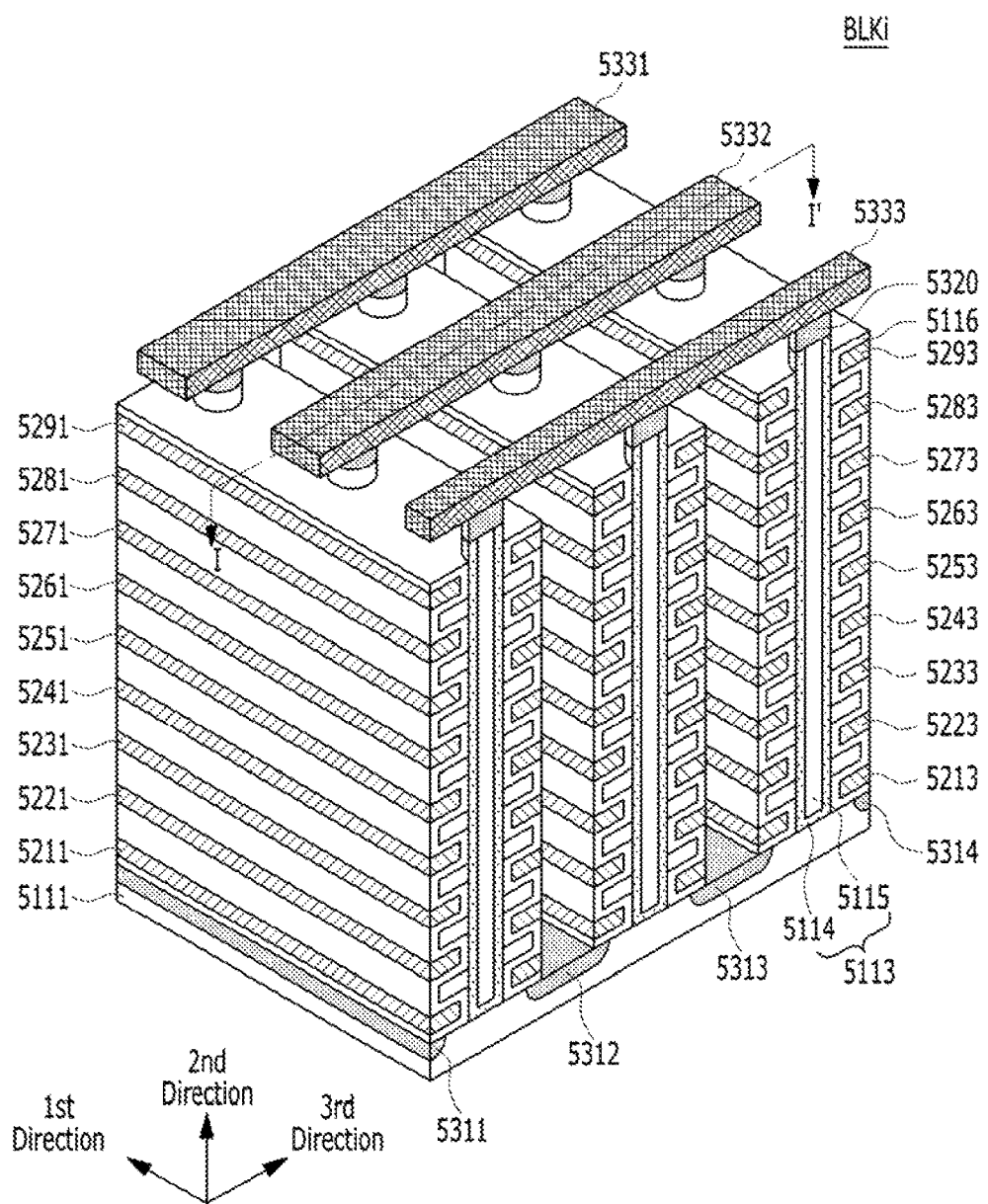
Figure 6:
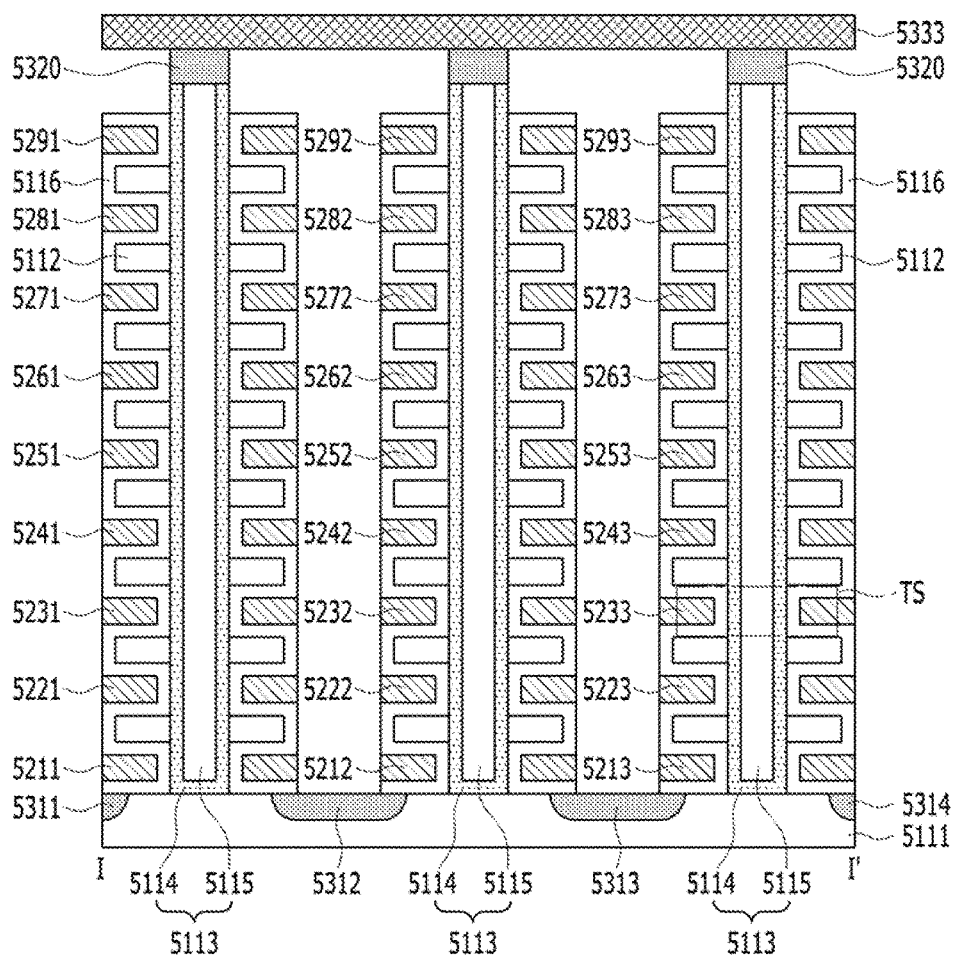

FIG. 5 is a perspective view of one BLKi of the plural memory blocks BLK0 to BLKN−1 shown in FIG. 4. FIG. 6 is a cross-sectional view taken along a line I-I' of the memory block BLKi shown in FIG. 5.

Referring to FIGS. 5 and 6, a memory block BLKi among the plurality of memory blocks of the memory device 150 may include a structure which extends in the first to third directions.

A substrate 5111 may be provided. The substrate 5111 may include a silicon material doped with a first type impurity. The substrate 5111 may include a silicon material doped with a p-type impurity or may be a p-type well, for example, a pocket p-well, and include an n-type well which surrounds the p-type well. While it is assumed that the substrate 5111 is p-type silicon, it is to be noted that the substrate 5111 is not limited to being p-type silicon.

A plurality of doping regions 5311 to 5314 which extend in the first direction may be provided over the substrate 5111. The plurality of doping regions 5311 to 5314 may contain a second type of impurity that is different from the substrate 5111. The plurality of doping regions 5311 to 5314 may be doped with an n-type impurity. While it is assumed here that first to fourth doping regions 5311 to 5314 are n-type, it is to be noted that the first to fourth doping regions 5311 to are not limited to being n-type.

In the region over the substrate 5111 between the first and second doping regions 5311 and 5312, a plurality of dielectric materials 5112 which extend in the first direction may be sequentially provided in the second direction. The dielectric materials 5112 and the substrate 5111 may be separated from one another by a predetermined distance in the second direction. The dielectric materials 5112 may be separated from one another by a predetermined distance in the second direction. The dielectric materials 5112 may include a dielectric material such as silicon oxide.

In the region over the substrate 5111 between the first and second doping regions 5311 and 5312, a plurality of pillars 5113 which are sequentially disposed in the first direction and pass through the dielectric materials 5112 in the second direction may be provided. The plurality of pillars 5113 may respectively pass through the dielectric materials 5112 and may be electrically coupled with the substrate 5111. Each pillar 5113 may be configured by a plurality of materials. The surface layer 5114 of each pillar 5113 may include a silicon material doped with the first type of impurity. The surface layer 5114 of each pillar 5113 may include a silicon material doped with the same type of impurity as the substrate 5111. While it is assumed here that the surface layer 5114 of each pillar 5113 may include p-type silicon, the surface layer 5114 of each pillar 5113 is not limited to being p-type silicon.

An inner layer 5115 of each pillar 5113 may be formed of a dielectric material. The inner layer 5115 of each pillar 5113 may be filled by a dielectric material such as silicon oxide.

In the region between the first and second doping regions 5311 and 5312, a dielectric layer 5116 may be provided along the exposed surfaces of the dielectric materials 5112, the pillars 5113 and the substrate 5111. The thickness of the dielectric layer 5116 may be less than half of the distance between the dielectric materials 5112. In other words, a region in which a material other than the dielectric material 5112 and the dielectric layer 5116 may be disposed, may be provided between (i) the dielectric layer 5116 provided over the bottom surface of a first dielectric material of the dielectric materials 5112 and (ii) the dielectric layer 5116 provided over the top surface of a second dielectric material of the dielectric materials 5112. The dielectric materials 5112 lie below the first dielectric material.

In the region between the first and second doping regions 5311 and 5312, conductive materials 5211 to 5291 may be provided over the exposed surface of the dielectric layer 5116. The conductive material 5211 which extends in the first direction may be provided between the dielectric material 5112 adjacent to the substrate 5111 and the substrate 5111. In particular, the conductive material 5211 which extends in the first direction may be provided between (i) the dielectric layer 5116 disposed over the substrate 5111 and (ii) the dielectric layer 5116 disposed over the bottom surface of the dielectric material 5112 adjacent to the substrate 5111.

The conductive material which extends in the first direction may be provided between (i) the dielectric layer 5116 disposed over the top surface of one of the dielectric materials 5112 and (ii) the dielectric layer 5116 disposed over the bottom surface of another dielectric material of the dielectric materials 5112, which is disposed over the certain dielectric material 5112. The conductive materials 5221 to 5281 which extend in the first direction may be provided between the dielectric materials 5112. The conductive material 5291 which extends in the first direction may be provided over the uppermost dielectric material 5112. The conductive materials 5211 to 5291 which extend in the first direction may be a metallic material. The conductive materials 5211 to 5291 which extend in the first direction may be a conductive material such as polysilicon.

In the region between the second and third doping regions 5312 and 5313, the same structures as the structures between the first and second doping regions 5311 and 5312 may be provided. For example, in the region between the second and third doping regions 5312 and 5313, the plurality of dielectric materials 5112 which extend in the first direction, the plurality of pillars 5113 which are sequentially arranged in the first direction and pass through the plurality of dielectric materials 5112 in the second direction, the dielectric layer 5116 which is provided over the exposed surfaces of the plurality of dielectric materials 5112 and the plurality of pillars 5113, and the plurality of conductive materials 5212 to 5292 which extend in the first direction may be provided.

In the region between the third and fourth doping regions 5313 and 5314, the same structures as between the first and second doping regions 5311 and 5312 may be provided. For example, in the region between the third and fourth doping regions 5313 and 5314, the plurality of dielectric materials 5112 which extend in the first direction, the plurality of pillars 5113 which are sequentially arranged in the first direction and pass through the plurality of dielectric materials 5112 in the second direction, the dielectric layer 5116 which is provided over the exposed surfaces of the plurality of dielectric materials 5112 and the plurality of pillars 5113, and the plurality of conductive materials 5213 to 5293 which extend in the first direction may be provided.

Drains 5320 may be respectively provided over the plurality of pillars 5113. The drains 5320 may be silicon materials doped with second type impurities. The drains 5320 may be silicon materials doped with n-type impurities. While it is assumed for the sake of convenience that the drains 5320 include n-type silicon, it is to be noted that the drains 5320 are not limited to being n-type silicon. For example, the width of each drain 5320 may be larger than the width of each corresponding pillar 5113. Each drain 5320 may be provided in the shape of a pad over the top surface of each corresponding pillar 5113.

Conductive materials 5331 to 5333 which extend in the third direction may be provided over the drains 5320. The conductive materials 5331 to 5333 may be sequentially disposed in the first direction. The respective conductive materials 5331 to 5333 may be electrically coupled with the drains 5320 of corresponding regions. The drains 5320 and the conductive materials 5331 to 5333 which extend in the third direction may be electrically coupled with through contact plugs. The conductive materials 5331 to 5333 which extend in the third direction may be a metallic material. The conductive materials 5331 to 5333 which extend in the third direction may be a conductive material such as polysilicon.

In FIGS. 5 and 6, the respective pillars 5113 may form strings together with the dielectric layer 5116 and the conductive materials 5211 to 5291, 5212 to 5292 and 5213 to 5293 which extend in the first direction. The respective pillars 5113 may form NAND strings NS together with the dielectric layer 5116 and the conductive materials 5211 to 5291, 5212 to 5292 and 5213 to 5293 which extend in the first direction. Each NAND string NS may include a plurality of transistor structures TS.

Figure 7:
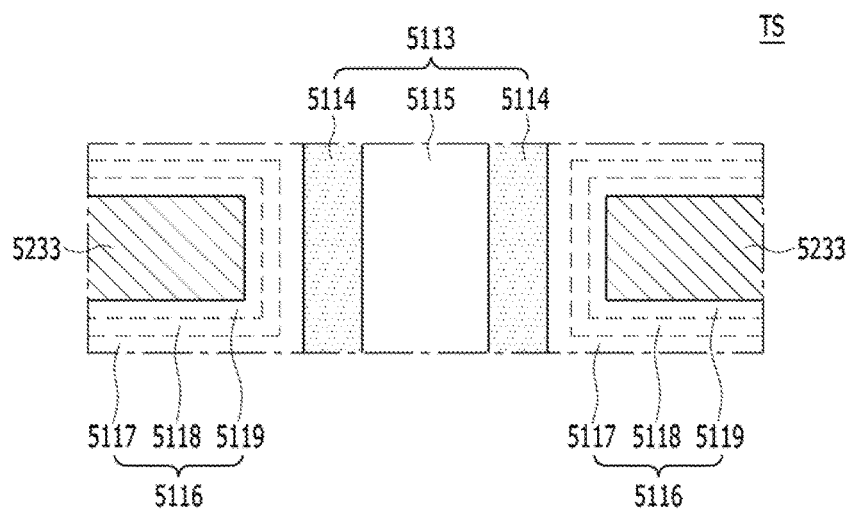

FIG. 7 is a cross-sectional view of the transistor structure TS shown in FIG. 6.

Referring to FIG. 7, in the transistor structure TS shown in FIG. 6, the dielectric layer 5116 may include first to third sub dielectric layers 5117, 5118 and 5119.

The surface layer 5114 of p-type silicon in each of the pillars 5113 may serve as a body. The first sub dielectric layer 5117 adjacent to the pillar 5113 may serve as a tunneling dielectric layer, and may include a thermal oxidation layer.

The second sub dielectric layer 5118 may serve as a charge storing layer. The second sub dielectric layer 5118 may serve as a charge capturing layer, and may include a nitride layer or a metal oxide layer such as an aluminum oxide layer, a hafnium oxide layer, or the like.

The third sub dielectric layer 5119 adjacent to the conductive material 5233 may serve as a blocking dielectric layer. The third sub dielectric layer 5119 adjacent to the conductive material 5233 which extends in the first direction may be formed as a single layer or multiple layers. The third sub dielectric layer 5119 may be a high-k dielectric layer such as an aluminum oxide layer, a hafnium oxide layer, or the like, which has a dielectric constant greater than the first and second sub dielectric layers 5117 and 5118.

The conductive material 5233 may serve as a gate or a control gate. That is, the gate or the control gate 5233, the blocking dielectric layer 5119, the charge storing layer 5118, the tunneling dielectric layer 5117 and the body 5114 may form a transistor or a memory cell transistor structure. For example, the first to third sub dielectric layers 5117 to 5119 may form an oxide-nitride-oxide (ONO) structure. In the embodiment, for the sake of convenience, the surface layer 5114 of p-type silicon in each of the pillars 5113 will be referred to as a body in the second direction.

The memory block BLKi may include the plurality of pillars 5113. Namely, the memory block BLKi may include the plurality of NAND strings NS. In detail, the memory block BLKi may include the plurality of NAND strings NS which extend in the second direction or a direction perpendicular to the substrate 5111.

Each NAND string NS may include the plurality of transistor structures TS which are disposed in the second direction. At least one of the plurality of transistor structures TS of each NAND string NS may serve as a string source transistor SST. At least one of the plurality of transistor structures TS of each NAND string NS may serve as a ground select transistor GST.

The gates or control gates may correspond to the conductive materials 5211 to 5291, 5212 to 5292 and 5213 to 5293 which extend in the first direction. In other words, the gates or the control gates may extend in the first direction and form word lines and at least two select lines, at least one source select line SSL and at least one ground select line GSL.

The conductive materials 5331 to 5333 which extend in the third direction may be electrically coupled to one end of the NAND strings NS. The conductive materials 5331 to 5333 which extend in the third direction may serve as bit lines BL. That is, in one memory block BLKi, the plurality of NAND strings NS may be electrically coupled to one bit line BL.

The second type doping regions 5311 to 5314 which extend in the first direction may be provided to the other ends of the NAND strings NS. The second type doping regions 5311 to 5314 which extend in the first direction may serve as common source lines CSL.

Namely, the memory block BLKi may include a plurality of NAND strings NS which extend in a direction perpendicular to the substrate 5111, e.g., the second direction, and may serve as a NAND flash memory block, for example, of a charge capturing type memory, in which a plurality of NAND strings NS are electrically coupled to one bit line BL.

While it is illustrated in FIGS. 5 to 7 that the conductive materials 5211 to 5291, 5212 to 5292 and 5213 to 5293 which extend in the first direction are provided in 9 layers, it is to be noted that the conductive materials 5211 to 5291, 5212 to 5292 and 5213 to 5293 which extend in the first direction are not limited to being provided in 9 layers. For example, conductive materials which extend in the first direction may be provided in 8 layers, 16 layers or any multiple of layers. In other words, in one NAND string NS, the number of transistors may be 8, 16 or more.

While it is illustrated in FIGS. 5 to 7 that 3 NAND strings NS are electrically coupled to one bit line BL, it is to be noted that the embodiment is not limited to having 3 NAND strings NS that are electrically coupled to one bit line BL. In the memory block BLKi, m number of NAND strings NS may be electrically coupled to one bit line BL, m being a positive integer. According to the number of NAND strings NS which are electrically coupled to one bit line BL, the number of conductive materials 5211 to 5291, 5212 to 5292 and 5213 to 5293 which extend in the first direction and the number of common source lines 5311 to 5314 may be controlled as well.

Further, while it is illustrated in FIGS. 5 to 7 that 3 NAND strings NS are electrically coupled to one conductive material which extends in the first direction, it is to be noted that the embodiment is not limited to having 3 NAND strings NS electrically coupled to one conductive material which extends in the first direction. For example, n number of NAND strings NS may be electrically coupled to one conductive material which extends in the first direction, n being a positive integer. According to the number of NAND strings NS which are electrically coupled to one conductive material which extends in the first direction, the number of bit lines 5331 to 5333 may be controlled as well.

Figure 8:
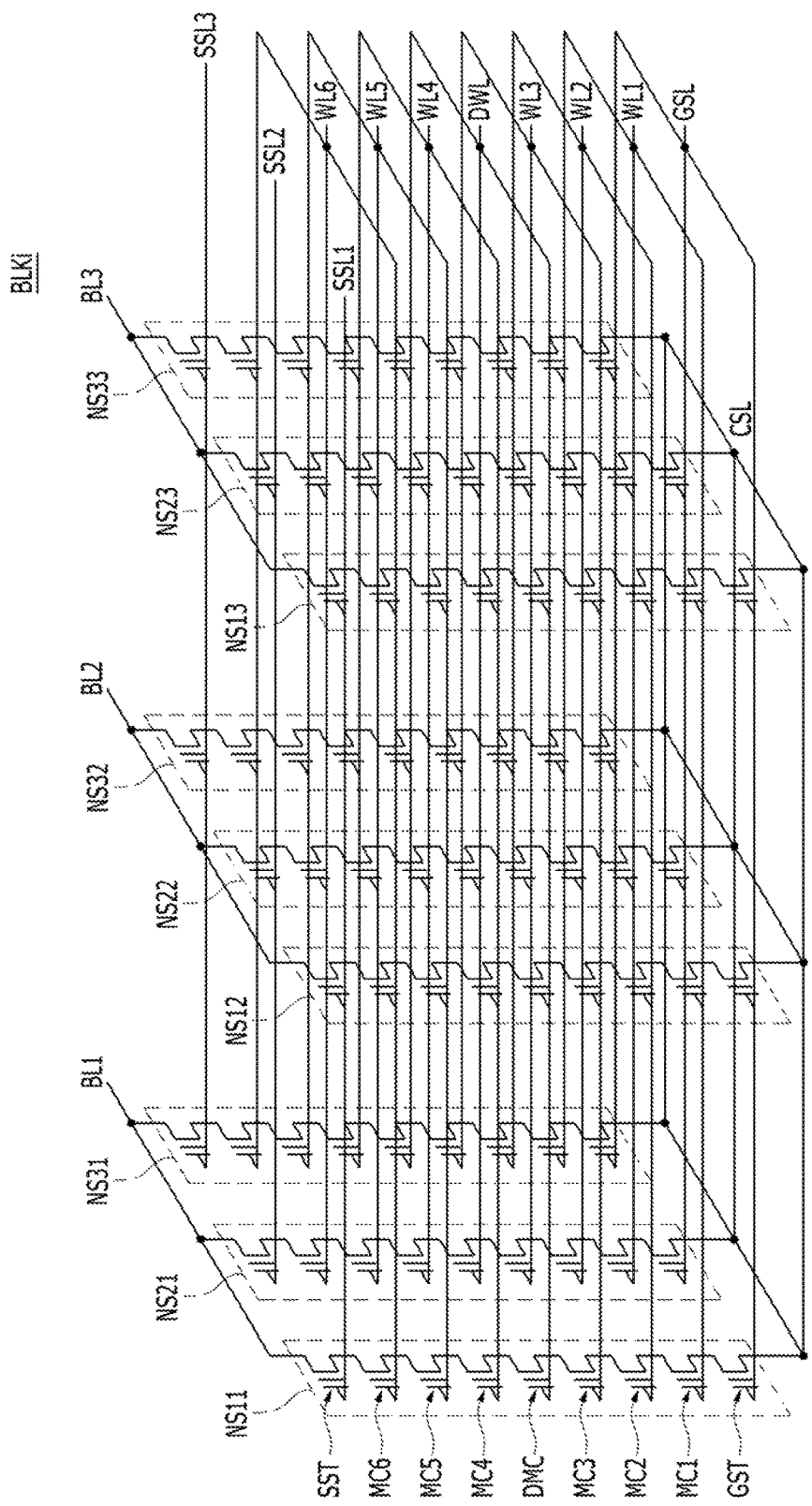

FIG. 8 is an equivalent circuit diagram illustrating the memory block BLKi having a first structure described with reference to FIGS. 5 to 7.

Referring to FIG. 8, in a block BLKi having the first structure, NAND strings NS11 to NS31 may be provided between a first bit line BL1 and a common source line CSL. The first bit line BL1 may correspond to the conductive material 5331 of FIGS. 5 and 6, which extends in the third direction. NAND strings NS12 to NS32 may be provided between a second bit line BL2 and the common source line CSL. The second bit line BL2 may correspond to the conductive material 5332 of FIGS. 5 and 6, which extends in the third direction. NAND strings NS13 to NS33 may be provided between a third bit line BL3 and the common source line CSL. The third bit line BL3 may correspond to the conductive material 5333 of FIGS. 5 and 6, which extends in the third direction.

A source select transistor SST of each NAND string NS may be electrically coupled to a corresponding bit line BL. A ground select transistor GST of each NAND string NS may be electrically coupled to the common source line CSL.

Memory cells MC may be provided between the source select transistor SST and the ground select transistor GST of each NAND string NS.

In this example, NAND strings NS may be defined by units of rows and columns and NAND strings NS which are electrically coupled to one bit line may form one column. The NAND strings NS11 to NS31 which are electrically coupled to the first bit line BL1 may correspond to a first column, the NAND strings NS12 to NS32 which are electrically coupled to the second bit line BL2 may correspond to a second column, and the NAND strings NS13 to NS33 which are electrically coupled to the third bit line BL3 may correspond to a third column. NAND strings NS which are electrically coupled to one source select line SSL may form one row. The NAND strings NS11 to NS13 which are electrically coupled to a first source select line SSL1 may form a first row, the NAND strings NS21 to NS23 which are electrically coupled to a second source select line SSL2 may form a second row, and the NAND strings NS31 to NS33 which are electrically coupled to a third source select line SSL3 may form a third row.

In each NAND string NS, a height may be defined. In each NAND string NS, the height of a memory cell MC1 adjacent to the ground select transistor GST may have a value '1'. In each NAND string NS, the height of a memory cell may increase as the memory cell gets closer to the source select transistor SST when measured from the substrate 5111. In each NAND string NS, the height of a memory cell MC6 adjacent to the source select transistor SST may be 7.

The source select transistors SST of the NAND strings NS in the same row may share the source select line SSL. The source select transistors SST of the NAND strings NS in different rows may be respectively electrically coupled to the different source select lines SSL1, SSL2 and SSL3.

The memory cells at the same height in the NAND strings NS in the same row may share a word line WL. That is, at the same height, the word lines WL electrically coupled to the memory cells MC of the NAND strings NS in different rows may be electrically coupled. Dummy memory cells DMC at the same height in the NAND strings NS of the same row may share a dummy word line DWL. Namely, at the same height or level, the dummy word lines DWL electrically coupled to the dummy memory cells DMC of the NAND strings NS in different rows may be electrically coupled.

The word lines WL or the dummy word lines DWL located at the same level or height or layer may be electrically coupled with one another at layers where the conductive materials 5211 to 5291, 5212 to 5292 and 5213 to 5293 which extend in the first direction may be provided. The conductive materials 5211 to 5291, 5212 to 5292 and 5213 to 5293 which extend in the first direction may be electrically coupled in common to upper layers through contacts. At the upper layers, the conductive materials 5211 to 5291, 5212 to 5292 and 5213 to 5293 which extend in the first direction may be electrically coupled. In other words, the ground select transistors GST of the NAND strings NS in the same row may share the ground select line GSL. Further, the ground select transistors GST of the NAND strings NS in different rows may share the ground select line GSL. That is, the NAND strings NS11 to NS13, NS21 to NS23 and NS31 to NS33 may be electrically coupled to the ground select line GSL.

The common source line CSL may be electrically coupled to the NAND strings NS. Over the active regions and over the substrate 5111, the first to fourth doping regions 5311 to 5314 may be electrically coupled. The first to fourth doping regions 5311 to 5314 may be electrically coupled to an upper layer through contacts and, at the upper layer, the first to fourth doping regions 5311 to 5314 may be electrically coupled.

Namely, as shown in FIG. 8, the word lines WL of the same height or level may be electrically coupled. Accordingly, when a word line WL at a specific height is selected, all NAND strings NS which are electrically coupled to the word line WL may be selected. The NAND strings NS in different rows may be electrically coupled to different source select lines SSL. Accordingly, among the NAND strings NS electrically coupled to the same word line WL, by selecting one of the source select lines SSL1 to SSL3, the NAND strings NS in the unselected rows may be electrically isolated from the bit lines BL1 to BL3. In other words, by selecting one of the source select lines SSL1 to SSL3, a row of NAND strings NS may be selected. Moreover, by selecting one of the bit lines BL1 to BL3, the NAND strings NS in the selected rows may be selected in units of columns.

In each NAND string NS, a dummy memory cell DMC may be provided. In FIG. 8, the dummy memory cell DMC may be provided between a third memory cell MC3 and a fourth memory cell MC4 in each NAND string NS. That is, first to third memory cells MC1 to MC3 may be provided between the dummy memory cell DMC and the ground select transistor GST. Fourth to sixth memory cells MC4 to MC6 may be provided between the dummy memory cell DMC and the source select transistor SST. The memory cells MC of each NAND string NS may be divided into memory cell groups by the dummy memory cell DMC. In the divided memory cell groups, memory cells, for example, MC1 to MC3, adjacent to the ground select transistor GST may be referred to as a lower memory cell group, and memory cells, for example, MC4 to MC6, adjacent to the string select transistor SST may be referred to as an upper memory cell group.

Herein below, detailed descriptions will be made with reference to FIGS. 9 to 11, which show the memory device in the memory system according to an embodiment implemented with a three-dimensional (3D) nonvolatile memory device different from the first structure.

Figure 9:
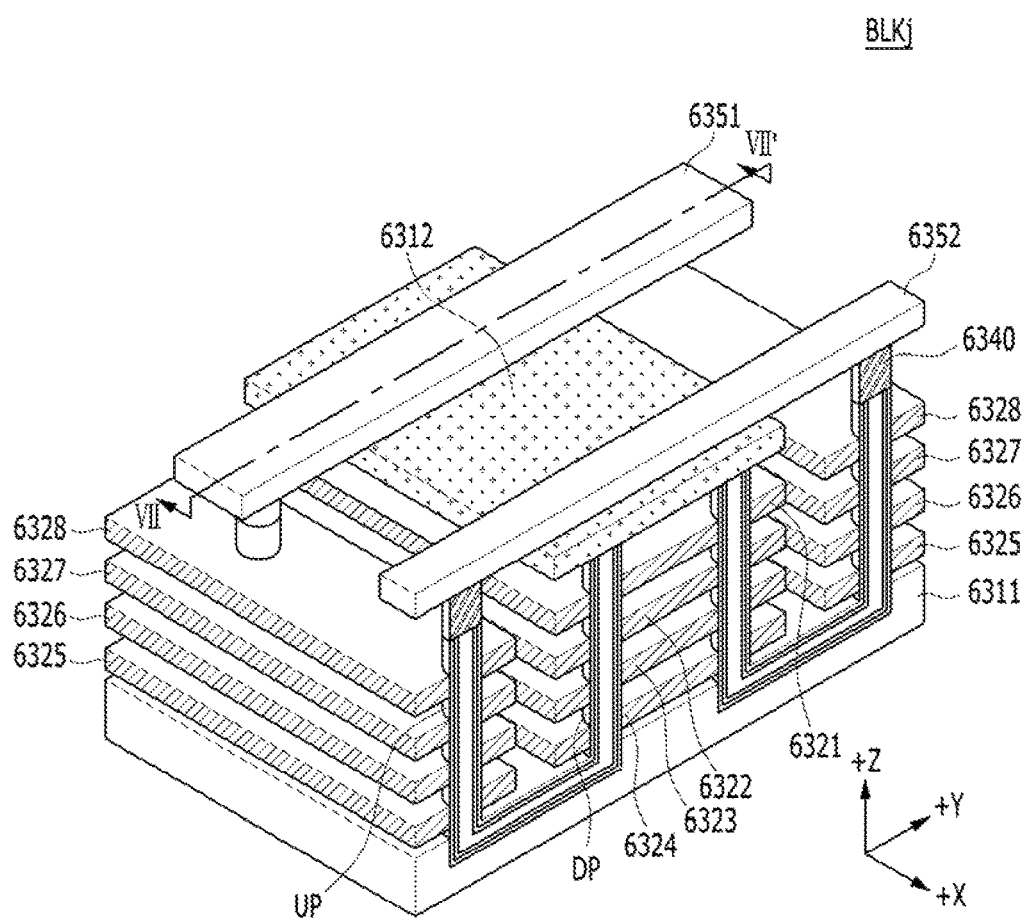

FIG. 9 is a perspective view schematically illustrating the memory device implemented with the three-dimensional (3D) nonvolatile memory device, which is different from the first structure described above with reference to FIGS. 5 to 8, and showing a memory block BLKj of the plurality of memory blocks of FIG. 4. FIG. 10 is a cross-sectional view illustrating the memory block BLKj taken along the line VII-VII' of FIG. 9.

Figure 10:
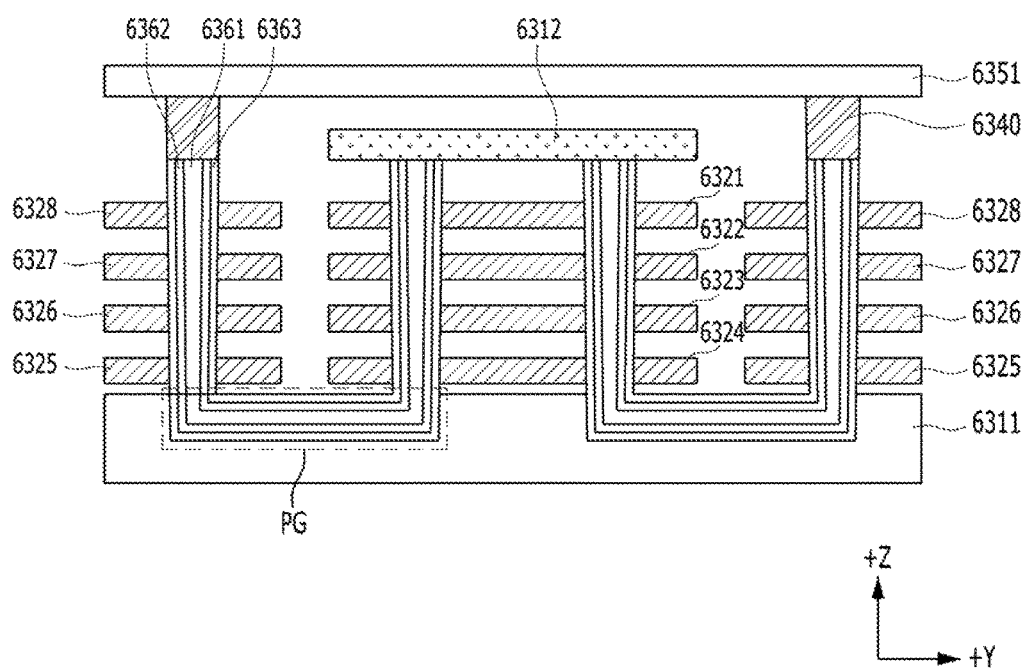

Referring to FIGS. 9 and 10, the memory block BLKj among the plurality of memory blocks of the memory device 150 of FIG. 1 may include structures which extend in the first to third directions.

A substrate 6311 may be provided. For example, the substrate 6311 may include a silicon material doped with a first type impurity. For example, the substrate 6311 may include a silicon material doped with a p-type impurity or may be a p-type well, for example, a pocket p-well, and include an n-type well which surrounds the p-type well. While it is assumed in the embodiment for the sake of convenience that the substrate 6311 is p-type silicon, it is to be noted that the substrate 6311 is not limited to being p-type silicon.

First to fourth conductive materials 6321 to 6324 which extend in the x-axis direction and the y-axis direction are provided over the substrate 6311. The first to fourth conductive materials 6321 to 6324 may be separated by a predetermined distance in the z-axis direction.

Fifth to eighth conductive materials 6325 to 6328 which extend in the x-axis direction and the y-axis direction may be provided over the substrate 6311. The fifth to eighth conductive materials 6325 to 6328 may be separated by the predetermined distance in the z-axis direction. The fifth to eighth conductive materials 6325 to 6328 may be separated from the first to fourth conductive materials 6321 to 6324 in the y-axis direction.

A plurality of lower pillars DP which pass through the first to fourth conductive materials 6321 to 6324 may be provided. Each lower pillar DP extends in the z-axis direction. Also, a plurality of upper pillars UP which pass through the fifth to eighth conductive materials 6325 to 6328 may be provided. Each upper pillar UP extends in the z-axis direction.

Each of the lower pillars DP and the upper pillars UP may include an Internal material 6361, an intermediate layer 6362, and a surface layer 6363. The intermediate layer 6362 may serve as a channel of the cell transistor. The surface layer 6363 may include a blocking dielectric layer, a charge storing layer and a tunneling dielectric layer.

The lower pillar DP and the upper pillar UP may be electrically coupled through a pipe gate PG. The pipe gate PG may be disposed in the substrate 6311. For instance, the pipe gate PG may include the same material as the lower pillar DP and the upper pillar UP.

A doping material 6312 of a second type which extends in the x-axis direction and the y-axis direction may be provided over the lower pillars DP. For example, the doping material 6312 of the second type may include an n-type silicon material. The doping material 6312 of the second type may serve as a common source line CSL.

Drains 6340 may be provided over the upper pillars UP. The drains 6340 may include an n-type silicon material. First and second upper conductive materials 6351 and 6352 which extend in the y-axis direction may be provided over the drains 6340.

The first and second upper conductive materials 6351 and 6352 may be separated in the x-axis direction. The first and second upper conductive materials 6351 and 6352 may be formed of a metal. The first and second upper conductive materials 6351 and 6352 and the drains 6340 may be electrically coupled through contact plugs. The first and second upper conductive materials 6351 and 6352 respectively serve as first and second bit lines BL1 and BL2.

The first conductive material 6321 may serve as a source select line SSL, the second conductive material 6322 may serve as a first dummy word line DWL1, and the third and fourth conductive materials 6323 and 6324 serve as first and second main word lines MWL1 and MWL2, respectively. The fifth and sixth conductive materials 6325 and 6326 serve as third and fourth main word lines MWL3 and MWL4, respectively, the seventh conductive material 6327 may serve as a second dummy word line DWL2, and the eighth conductive material 6328 may serve as a drain select line DSL.

The lower pillar DP and the first to fourth conductive materials 6321 to 6324 adjacent to the lower pillar DP form a lower string. The upper pillar UP and the fifth to eighth conductive materials 6325 to 6328 adjacent to the upper pillar UP form an upper string. The lower string and the upper string may be electrically coupled through the pipe gate PG. One end of the lower string may be electrically coupled to the doping material 6312 of the second type which serves as the common source line CSL. One end of the upper string may be electrically coupled to a corresponding bit line through the drain 6340. One lower string and one upper string form one cell string which is electrically coupled between the doping material 6312 of the second type serving as the common source line CSL and a corresponding one of the upper conductive material layers 6351 and 6352 serving as the bit line BL.

That is, the lower string may include a source select transistor SST, the first dummy memory cell DMC1, and the first and second main memory cells MMC1 and MMC2. The upper string may include the third and fourth main memory cells MMC3 and MMC4, the second dummy memory cell DMC2, and a drain select transistor DST.

In FIGS. 9 and 10, the upper string and the lower string may form a NAND string NS, and the NAND string NS may include a plurality of transistor structures TS. Since the transistor structure included in the NAND string NS in FIGS. 9 and 10 is described above in detail with reference to FIG. 7, a detailed description thereof will be omitted herein.

Figure 11:
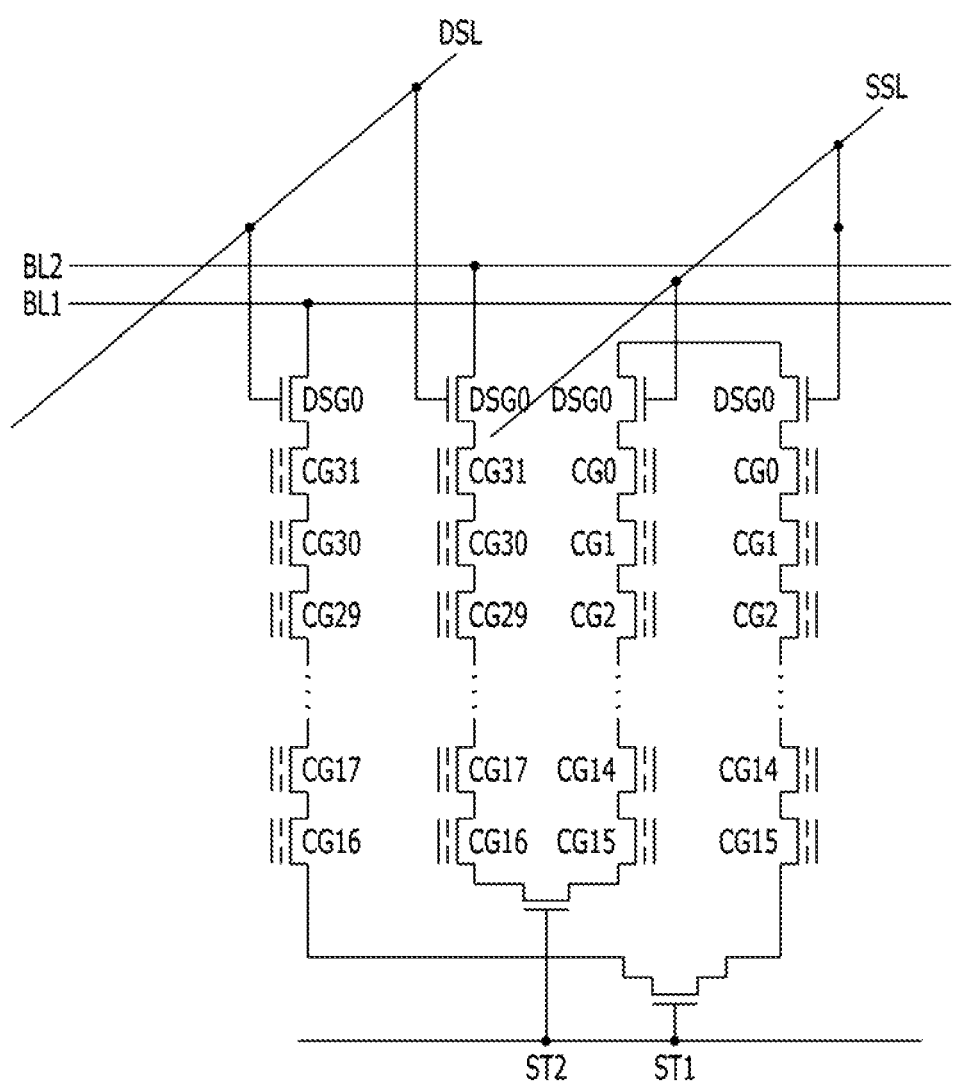

FIG. 11 is a circuit diagram illustrating the equivalent circuit of the memory block BLKj having the second structure as described above with reference to FIGS. 9 and 10. For the sake of convenience, only a first string and a second string, which form a pair in the memory block BLKj in the second structure are shown.

Referring to FIG. 11, in the memory block BLKj having the second structure among the plurality of blocks of the memory device 150, cell strings, each of which is implemented with one upper string and one lower string electrically coupled through the pipe gate PG as described above with reference to FIGS. 9 and 10, may be provided in such a way as to define a plurality of pairs.

Namely, in the certain memory block BLKj having the second structure, memory cells CG0 to CG31 stacked along a first channel CH1 (not shown), for example, at least one source select gate SSG1 and at least one drain select gate DSG1 may form a first string ST1, and memory cells CG0 to CG31 stacked along a second channel CH2 (not shown), for example, at least one source select gate SSG2 and at least one drain select gate DSG2 may form a second string ST2.

The first string ST1 and the second string ST2 may be electrically coupled to the same drain select line DSL and the same source select line SSL. The first string ST1 may be electrically coupled to a first bit line BL1, and the second string ST2 may be electrically coupled to a second bit line BL2.

While it is described in FIG. 11 that the first string ST1 and the second string ST2 are electrically coupled to the same drain select line DSL and the same source select line SSL, it may be envisaged that the first string ST1 and the second string ST2 may be electrically coupled to the same source select line SSL and the same bit line BL, the first string ST1 may be electrically coupled to a first drain select line DSL1 and the second string ST2 may be electrically coupled to a second drain select line DSL2. Further it may be envisaged that the first string ST1 and the second string ST2 may be electrically coupled to the same drain select line DSL and the same bit line BL, the first string ST1 may be electrically coupled to a first source select line SSL1 and the second string ST2 may be electrically coupled a second source select line SSL2.

Hereinafter, a data processing operation to a memory device in a memory system will be described in detail with reference to FIGS. 12 to 15 according to an embodiment of the invention. More particularly, a data processing operation for reading data from the memory device will be described in detail, as an example.

Figure 12:
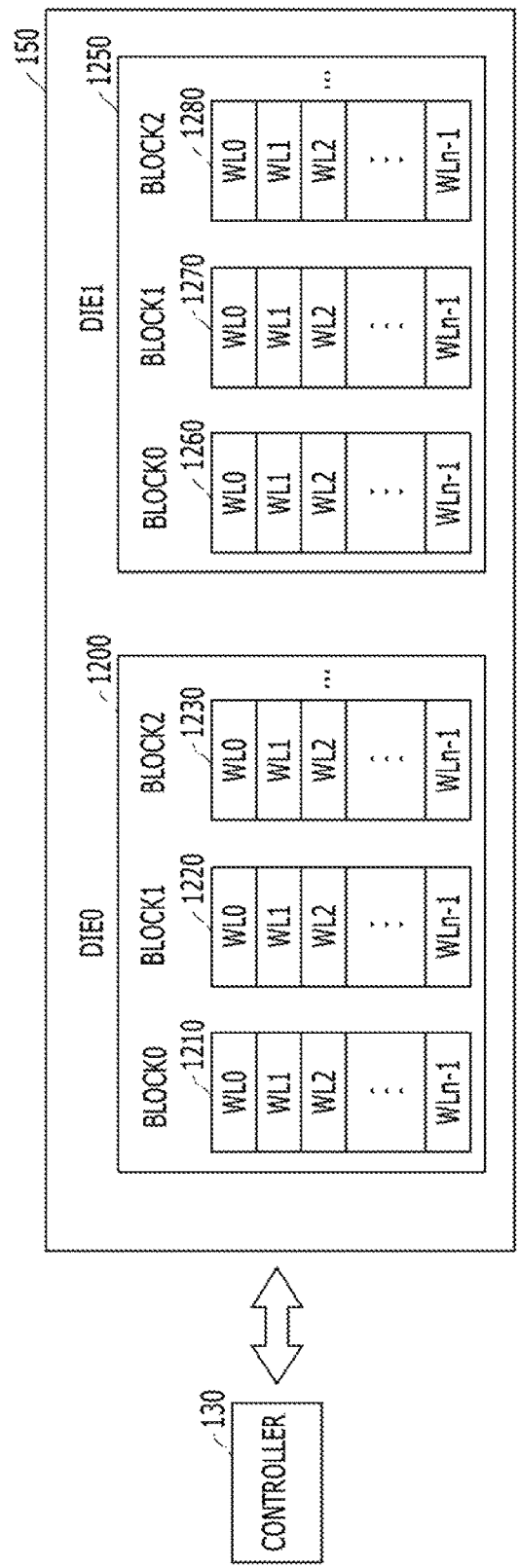
FIGS. 12 to 14 are diagrams schematically illustrating a data processing operation for a memory system, according to an embodiment of the invention.
Figure 13:
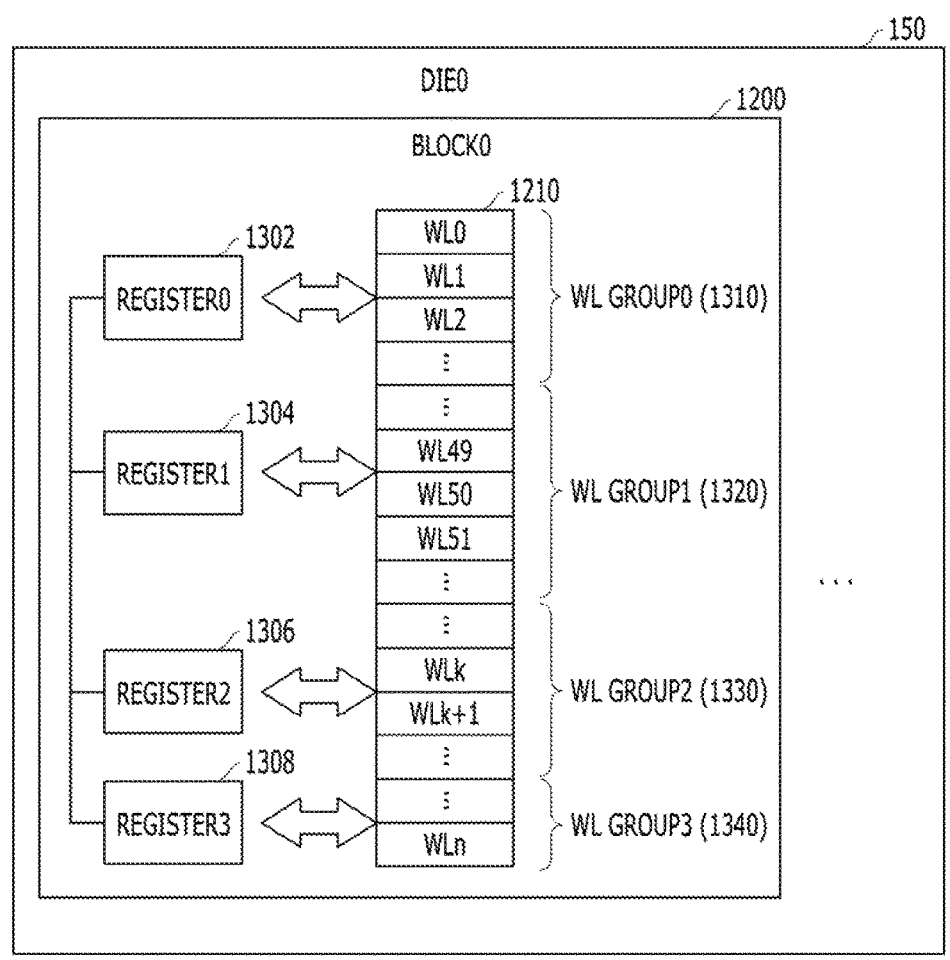
Figure 14:
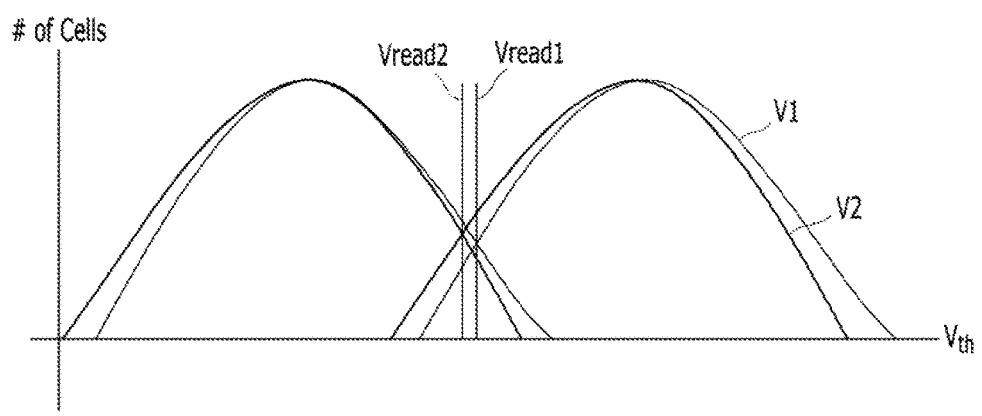

FIGS. 12 to 14 schematically describe a data processing operation to a memory device in a memory system in an embodiment. Hereafter, it is described, as an example, that the memory system 110 of FIG. 1 reads data from a plurality of memory blocks included in the memory device 150 of FIG. 1, in response to a read command received from the host 102 of FIG. 1. The memory system 110 may store the read data in a buffer/cache included in the memory 144 of the controller 130 of FIG. 1 and may then provide the data stored in the buffer/cache to the host 102.

In an embodiment, as described above, write data corresponding to a write command received from the host 102 is programmed and stored in the memory blocks of the memory device 150. Particularly, in each of the memory blocks, a plurality of word lines, and a plurality of pages including a plurality of memory cells coupled to the plurality of word lines are included, and write data is programmed and stored in pages of a corresponding memory block. Furthermore, in order to read the write data programmed in the pages of the memory blocks when a read command is received from the host 102, a read voltage is applied to one or more word lines of corresponding memory blocks. The data read from the memory blocks is provided to the host 102 through the buffer/cache of the controller 130.

In an embodiment, when a read operation for data stored in one or more pages of a memory block fails, a read retry operation for the one or more word lines of the memory block for which the read operation failed is performed by changing a read voltage level according to a read retry table (hereinafter, referred to as an 'RRT'). Particularly, in an embodiment, the word lines included in each of the memory blocks are grouped into a plurality of word line groups each having a predetermined number of word lines. For example, each of the memory blocks is divided into a plurality of word line groups. The RRT is stored and managed so that a read retry operation due to a read fail is performed by each of the word line groups.

The memory blocks may be divided into a plurality of word line groups, by taking into account critical voltages, or successive physical positions of the word lines included in the memory blocks. For example, as described with reference to FIG. 2, N memory blocks may be included in the memory device 150, and N word lines may be included in each of the N memory blocks. The word lines included in each of the memory blocks may be grouped into a predetermined number of groups, that is, divided into K word line groups. For example, the same number of word line groups may be included in each of the memory blocks.

In an embodiment, the memory blocks may have different number of word line groups. Also, in an embodiment, a word line group included in a first memory block may include word lines included in one or more other memory blocks. For example, the first and the one or more other memory blocks may be adjacent memory blocks. Consequently, a word line group may be included in both the first memory block and the one or more other memory blocks, or stated otherwise, the first memory block and the one or more other memory blocks may share a common word line group.

In the memory device 150, a plurality of RRTs may be set and managed. For example, at least one RRT may be set and managed for each of the memory dies of the memory device 150. Each memory die may have a plurality of memory blocks. When setting and managing the one or more RRTs for each of the memory dies, each RRT may be applied for all the word lines included in the memory die at a read retry operation. Hence, even when a read retry operation is performed for an arbitrary word line for which a read fail has occurred, the read voltage levels for all of the word lines included in the memory die may be changed.

On the other hand, RRTs may be set and managed for each word line included in each memory block. When setting and managing the RRTs for each word line included in each memory block, set commands for setting and application of the RRTs are transmitted to every word line for which a read fail has occurred, whereby the read operation performance may deteriorate. Therefore, in an embodiment, the word lines included in each of the memory blocks of the memory device 150 are grouped into word line groups, and RRTs are set and managed for each word line group, whereby transmission of set commands for the setting and application of the RRTs may be minimized, and the read operation performance may be enhanced.

Hereinafter, although it will be described as an example that a data processing operation in the memory system is performed by the controller 130, the processor 134 included in the controller 130 may perform the data processing operation, for example, through an FTL, as described above.

In an embodiment, the controller 130 reads, from the memory blocks of the memory device 150, read data corresponding to a read command received from the host 102, stores the read data in the buffer included in the memory 144 of the controller 130, and then provides the data stored in the buffer to the host 102. As described above, in the case where a read operation corresponding to the read command fails, that is, a read fall occurs, the controller 130 may perform a read retry operation for the one or more memory blocks of the memory device 150 for which the read fail has occurred. For the read retry operation, the controller 120 may transmit a set command to the memory device 150, so as to set and apply RRTs for the word line groups included in the one or more memory blocks for which the read fail has occurred. For example, the controller 130 transmits a set parameter command to the one or more memory blocks for which the read fall has occurred, and accordingly sets and applies RRTs for respective word line groups included in these memory blocks. For instance, the controller 130 sets and applies RRTs to the respective word line groups through registers corresponding to the respective word line groups in each of the memory blocks, so that read voltage levels are set by the respective word line groups, and a read retry operation is performed for the word lines for which the read fail has occurred.

Referring to FIG. 12, the controller 130 reads, from the memory device 150, read data corresponding to a read command received from the host 102 and provides it to the host 102. In detail, the controller 130 applies a read voltage to a memory block in which the read data is stored among a plurality of memory blocks of a plurality of memory dies, e.g., a zeroth die (DIE0) 1200 and a first die (DIE1) 1250, included in the memory device 150, and thus reads the read data from the corresponding memory block before providing it to the host 102.

The plurality of memory dies included in the memory device 150, for example, the zeroth die 1200 and the first die 1250, include a plurality of memory blocks, for example, respectively, zeroth blocks (BLOCK0) 1210 and 1260, first blocks (BLOCK1) 1220 and 1270, and second blocks (BLOCK2) 1230 and 1280. Each of the blocks 1210, 1220, 1230, 1260, 1270 and 1280 of the zeroth die 1200 and the first die 1250 includes a plurality of word lines, for example, N word lines WL0, WL1, WL2, . . . , WLn−1, and a plurality of pages each of which includes a plurality of memory cells respectively coupled to the N word lines. The controller 130 programs and stores write data corresponding to a write command received from the host 102 in pages of a corresponding memory block. Hereinafter, it will be described as an example that data processing is performed to read data stored in the zeroth block 1210 of the zeroth die 1200 of the memory device 150.

Referring to FIG. 13, the controller 130 reads, from the zeroth block 1210 of the zeroth die 1200 of the memory device 150, read data corresponding to a read command received from the host 102 and provides it to the host 102. In this regard, when the read operation for the zeroth block 1210 fails, and a read fall occurs to the zeroth block 1210, the controller 130 sets and applies an RRT to the zeroth block 1210 so as to perform a read retry operation for the zeroth block 1210. That is, the controller 120 transmits a set command, e.g., a set parameter command, to the zeroth block 1201, so as to change the read voltage level of the zeroth block 1210.

As described above, the zeroth block 1210 in the zeroth die 1200 of the memory device 150 includes a plurality of word lines, for example, N word lines, and the N word lines are grouped into a plurality of word line groups each of which includes a predetermined number of word lines. That is, the zeroth block 1210 is divided into a plurality of word line groups. Hereinafter, there will be described in detail, as an example, a configuration in which the plurality of word lines included in the zeroth block 1210 of the zeroth die 1200 of the memory device 150 are grouped into four word line groups. That is, the zeroth block 1210 is divided into fourth word line groups, for example, a zeroth word line group (WL_GROUP0) 1310, a first word line group (WL_GROUP1) 1320, a second word line group (WL_GROUP2) 1330 and a third word line group (WL_GROUP3) 1340, as illustrated in FIG. 13.

Furthermore, the word line groups included in the zeroth block 1210 of the zeroth die 1200 of the memory device 150, for example, the zeroth word line group 1310, the first word line group 1320, the second word line group 1330 and the third word line group 1340, may include word lines included in other memory blocks of the zeroth die 1200 of the memory device 150, for example, word lines included in the first block 1220 or the second block 1230. For example, the zeroth word line group 1310 of the zeroth block 1210 may include some of the word lines included and grouped in the first block 1220. That is, the zeroth word line group 1310 may become one of word line groups included in the first block 1220. The first word line group 1320 may include some of the word lines included and grouped in the first block 1220, and become one of word line groups included in the first block 1220. The second word line group 1330 may include some of the word lines included and grouped in the first block 1220, and become one of word line groups included in the first block 1220. The third word line group 1340 may include some of the word lines included and grouped in the first block 1220, and become one of word line groups included in the first block 1220.

The zeroth block 1210 in the zeroth die 1200 of the memory device 150 includes four word line groups 1310, 1320, 1330 and 1340. In the memory device 150 or the zeroth die 1200 of the memory device 150, registers, e.g., a zeroth register (REGISTER0) 1302, a first register (REGISTER1) 1304, a second register (REGISTER2) 1306 and a third register (REGISTER3) 1308, which respectively correspond to the word line groups 1310, 1320, 1330 and 1340 of the zeroth block 1210, are included. For simple explanation, the following description will be focused on a configuration in which the registers 1302, 1304, 1306 and 1308 that respectively correspond to the word line groups 1310, 1320, 1330 and 1340 are included in the memory device 150 or the zeroth die 1200. In an embodiment, however, a single register for the word line groups 1310, 1320, 1330 and 1340 may be included in the memory device 150 or the zeroth die 1200. First, the configuration in which the registers 1302, 1304, 1306 and 1308 that respectively correspond to the word line groups 1310, 1320, 1330 and 1340 are included in the memory device 150 or the zeroth die 1200 will be described in more detail as an example with reference to FIG. 13.

In the zeroth die 1200 of the memory device 150, the same number of registers and word line groups are included. Furthermore, as described above, in the case where a read fall occurs in the zeroth block 1210 and thus a read retry operation is performed for the zeroth block 1210, RRTs are set to change read voltage levels in the respective word line groups 1310, 1320, 1330 and 1340 through the respective registers 1302, 1304, 1306 and 1308 corresponding to the word line groups 1310, 1320, 1330 and 1340. In this way, the RRTs are set and applied corresponding to the respective word line groups 1310, 1320, 1330 and 1340. In this regard, each of the RRTs corresponding to the respective word line groups 1310, 1320, 1330 and 1340 is determined taking into account temperature, a program/erase (P/E) cycle or an erase/write (E/W) cycle, retention, etc. in the corresponding one of the word line groups 1310, 1320, 1330, and 1340.

In addition, the zeroth register 1302 corresponds to the zeroth word line group 1310 of the zeroth block 1210. In response to a read fail in the zeroth word line group 1310, the zeroth register 1302 sets and applies an RRT for the zeroth word line group 1310, that is, changes the read voltage level for the zeroth word line group 1310. The first register 1304 corresponds to the first word line group 1320 of the zeroth block 1210. In response to a read fail in the first word line group 1320, the first register 1304 sets and applies an RRT for the first word line group 1320, that is, changes the read voltage level for the first word line group 1320. The second register 1306 corresponds to the second word line group 1330 of the zeroth block 1210. In response to a read fall in the second word line group 1330, the second register 1306 sets and applies an RRT for the second word line group 1330, that is, changes the read voltage level for the second word line group 1330. The third register 1308 corresponds to the third word line group 1340 of the zeroth block 1210. In response to a read fall in the third word line group 1340, the third register 1308 sets and applies an RRT for the third word line group 1340, that is, changes the read voltage level for the third word line group 1340. Hence, as described above, according to an embodiment of the invention, a single register corresponds to a single word line group so that when a read fail occurs in a word line group only the corresponding register to the word line group for which the read fail occurred responds to set and apply an RRT for the word line group for which the read fail occurred.

For example, if read falls occur on a zeroth word line WL0, a fiftieth word line WL50, and a $k_{th}$ word line WLk while a read operation is performed for the zeroth block 1210 included in the zeroth die 1200 of the memory device 150, the controller 130 checks for the read falls on the zeroth word line WL0, the fiftieth word line WL50, and the km word line WLk and then separately checks for the failed word line groups that include the zeroth word line WL0, the fiftieth word line WL50, and the $k_{th}$ word line WLk for which the read fails have occurred. The controller 130 then transmits a set command, for example, a set parameter command to the zeroth block 1210 so as to perform a read retry operation for the word lines for which the read fails have occurred, for example, the zeroth word line WL0, the fiftieth word line WL50, and the $k_{th}$ word line WLk.

That is, the controller 130 transmits a set parameter command to the zeroth block 1210 so as to perform a read retry operation for the word lines WL0, WL50, and WLk for which the read fails have occurred. The set parameter command is transmitted to the registers that correspond to the respective fail word line groups, for example, the registers 1302, 1304, and 1306 that respectively correspond to the word line groups 1310, 1320, and 1330 which include the word lines WL0, WL50, and WLk for which the read fails have occurred.

The set parameter command includes information indicating the starting of the read retry operation for the word lines WL0, WL50, and WLk, for which the read fails have occurred, by setting and applying RRTs for the word line groups 1310, 1320, and 1330 that include the word lines WL0, WL50, and WLk. In other words, the set parameter command includes information indicating the start of changing the read voltage levels using the RRTs for the word line groups 1310, 1320, and 1330. Furthermore, the set parameter command also includes, information indicating ending the read retry operation for the word lines WL0, WL50, and WLk, corresponding to the information indicating the starting of the read retry operation for the word lines WL0, WL50, and WLk, information indicating ending the read retry operation for the word lines WL0, WL50, and WLk.

In addition, the set parameter command includes information indicating the registers 1302, 1304, and 1306 that correspond to the respective word line groups 1310, 1320, and 1330 in which there is the need to perform the read retry operation or set and apply the RRTs, for example, change the read voltage levels using the RRTs. That is, the set parameter command includes indication information for the respective registers 1302, 1304, and 1306 that perform a change in read voltage levels for the word line groups 1310, 1320, and 1330 using the RRTs. The set parameter command may include information including addresses, indexes, or identifiers of the registers 1302, 1304, and 1306. In this regard, the indication information for the registers 1302, 1304, and 1306 that is included in the set parameter command may include information indicating the word line groups 1310, 1320, and 1330 corresponding to the respective registers 1302, 1304, and 1306, for example, information including addresses, indexes, or identifiers of the word line groups 1310, 1320, and 1330.

In addition, the set parameter command may include voltage level values for changing the read voltage levels of the word line groups 1310, 1320, and 1330 using the RRTs.

For instance, the controller 130 determines read voltage levels to be changed in the word line groups 1310, 1320, and 1330 and sets, for the respective word line groups 1310, 1320, and 1330, voltage level values corresponding to the determined read voltage levels of the word line groups 1310, 1320, and 1330, and then includes the voltage level values in the set parameter command. When the controller 130 transmits the set parameter command to the registers 1302, 1304, and 1306 corresponding to the respective word line groups 1310, 1320, and 1330, the registers 1302, 1304, and 1306 check the voltage level values determined by the controller 130 and included in the set parameter command, and changes the respective read voltage levels of the word line groups 1310, 1320, and 1330 in response to the voltage level values. Read retry voltages having the changed read voltage levels are respectively applied to the word line groups 1310, 1320, and 1330. For example, the read voltage levels for the respective word line groups 1310, 1320, and 1330 that are determined by the controller 130 are changed by the respective registers 1302, 1304, and 1306, and the read retry voltages having the changed read voltage levels are applied to the respective word line groups 1310, 1320, and 1330.

Furthermore, the controller 130 includes the voltage level values of the word line groups 1310, 1320, and 1330 in the set parameter command, for example, sets offsets or RRT values of the read voltage levels to the level values and includes the set level values in the set parameter command. When the controller 130 transmits the set parameter command to the registers 1302, 1304, and 1306 corresponding to the respective word line groups 1310, 1320, and 1330, the respective registers 1302, 1304, and 1306 successively change the read voltage levels of the word line groups 1310, 1320, and 1330 depending upon the offsets. Read retry voltages having the changed read voltage levels are applied to the corresponding word line groups 1310, 1320, and 1330. Alternatively, depending on the RRT values in the RRTs included in the registers 1302, 1304, and 1306, the read voltage levels of the word line groups 1310, 1320, and 1330 are successively changed, and the read retry voltages having the changed read voltage levels are applied to the corresponding word line groups 1310, 1320, and 1330. In this regard, the RRT values are voltage level values referred to change the read voltage levels for the word lines for which the read fails have occurred through the RRTs included in the registers 1302, 1304, and 1306. The registers 1302, 1304, and 1306 successively change the read voltage levels of the word line groups 1310, 1320, and 1330 depending on the RRT values through the RRTs corresponding to the respective word line groups 1310, 1320, and 1330. The read retry voltages having the changed read voltage levels are applied to the respective word line groups 1310, 1320, and 1330.

That is, as described above, the controller 130 transmits the set command, for example, the set parameter command, to the registers 1302, 1304, and 1306 that correspond to the respective word line groups 1310, 1320, and 1330 which include the respective word lines WL0, WL50, and WLk for which the read fails have occurred. The set parameter command includes information indicating starting to change the read voltage levels using the RRTs, information indicating the registers 1302, 1304, and 1306, and level values for the read voltage levels of the word line groups 1310, 1320, and 1330. In this regard, the controller 130 may transmit the set parameter command even to the third register 1308 corresponding to the third word line group 1340 for which no read fail has occurred. The third register 1308 that receives the set parameter command is able to verify, through the information indicating the registers 1302, 1304, and 1306, that the set parameter command is not a command operation pertaining to itself.

The registers 1302, 1304, and 1306 that correspond to the respective word line groups 1310, 1320, and 1330 including the word lines WL0, WL50, and WLk for which the read fails have occurred check, after receiving the set parameter command from the controller 130, information included in the set parameter command, in particular, respectively check the level values for the read voltage levels of the word line groups 1310, 1320, and 1330, and then change the read voltage levels of the word line groups 1310, 1320, and 1330.

The read retry voltages having the changed read voltage levels are applied to the respective word line groups 1310, 1320, and 1330.

In more detail, the zeroth register 1302 verifies that a read fail has occurred on the word lines included in the zeroth word line group 1310 through, included in the set parameter command, the information indicating starting to change the read voltage levels and the information indicating the zeroth register 1302 or the zeroth word line group 1310. The zeroth register 1302 also verifies that the read retry operation is performed for the word lines for which the read fail has occurred, for example, that the read voltage level of the zeroth word line group 1310 is changed. The zeroth register 1302 checks the corresponding level value included in the set parameter command and changes the read voltage level of the zeroth word line group 1310 depending on the level value. The read retry voltage having the changed read voltage level is applied to the zeroth word line group 1310.

The zeroth register 1302 checks the read voltage level determined by the controller 130 through the level value, and changes the read voltage level of the zeroth word line group 1310. The read retry voltage having the changed read voltage level is applied to the zeroth word line group 1310. For example, the zeroth register 1302 checks the offset of the read voltage level through the level value, and changes a read voltage level in the preceding read operation for the zeroth word line group 1310 by the offset. The read retry voltage having the changed read voltage level is applied to the zeroth word line group 1310. Alternatively, the zeroth register 1302 checks the corresponding RRT value through the level value and changes the read voltage level of the zeroth word line group 1310 depending on the RRT value in the RRT for the zeroth word line group 1310. The zeroth register 1302 changes the read voltage level of the zeroth word line group 1310 to a read voltage level corresponding to the RRT value in the RRT. The read retry voltage having the changed read voltage level is applied to the zeroth word line group 1310.

That is, the zeroth register 1302 receives the set parameter command and changes the read voltage level of the zeroth word line group 1310 to a first read voltage level Vg1, and a first read retry voltage having the first read voltage level Vg1, e.g., a read retry voltage Vread1 in FIG. 14, is applied to the zeroth word line group 1310. The controller 130 performs, when the first read retry voltage is applied to the zeroth word line group 1310, a read retry operation for the zeroth word line WL0 for which the read fail has occurred in the zeroth word line group 1310, properly reads the read data stored in the zeroth word line WL0 through the read retry operation, and then provides it to the host 102.

The first register 1304 verifies that a read fall has occurred on the word lines included in the first word line group 1320 through, included in the set parameter command, the information indicating starting to change the read voltage levels and the information indicating the first register 1304 or the first word line group 1320. The first register 1304 also verifies that the read retry operation is performed for the word lines for which the read fall has occurred, for example, that the read voltage level of the first word line group 1320 is changed. The first register 1304 checks the corresponding level value included in the set parameter command and changes the read voltage level of the first word line group 1320 depending on the level value. The read retry voltage having the changed read voltage level is applied to the first word line group 1320.

The first register 1304 checks the read voltage level determined by the controller 130 through the level value, and changes the read voltage level of the first word line group 1320. The read retry voltage having the changed read voltage level is applied to the first word line group 1320. For example, the first register 1304 checks the offset of the read voltage level through the level value, and changes a read voltage level in the preceding read operation for the first word line group 1320 by the offset. The read retry voltage having the changed read voltage level is applied to the first word line group 1320. Alternatively, the first register 1304 checks the corresponding RRT value through the level value and changes the read voltage level of the first word line group 1320 depending on the RRT value in the RRT for the first word line group 1320. The first register 1304 changes the read voltage level of the first word line group 1320 to a read voltage level corresponding to the RRT value in the RRT. The read retry voltage having the changed read voltage level is applied to the first word line group 1320.

That is, the first register 1304 receives the set parameter command and changes the read voltage level of the first word line group 1320 to a second read voltage level Vg2, and a second read retry voltage having the second read voltage level Vg2, e.g., a read retry voltage Vread2 in FIG. 14, is applied to the first word line group 1320. The controller 130 performs, when the second read retry voltage is applied to the first word line group 1320, a read retry operation for the fiftieth word line WL50 for which the read fail has occurred in the first word line group 1320, properly reads the read data stored in the fiftieth word line WL50 through the read retry operation, and then provides it to the host 102.

The second register 1306 verifies that a read fail has occurred on the word lines included in the second word line group 1330 through, included in the set parameter command, the information indicating starting to change the read voltage levels and the information indicating the second register 1306 or the second word line group 1330. The second register 1306 also verifies that the read retry operation is performed for the word lines for which the read fail has occurred, for example, that the read voltage level of the second word line group 1330 is changed. The second register 1306 checks the level value included in the set parameter command and changes the read voltage level of the second word line group 1330 depending on the level value. The read retry voltage having the changed read voltage level is applied to the second word line group 1330.

The second register 1306 checks the read voltage level determined by the controller 130 through the level value, and changes the read voltage level of the second word line group 1330. The read retry voltage having the changed read voltage level is applied to the second word line group 1330. For example, the second register 1306 checks the offset of the read voltage level through the level value, and changes a read voltage level in the preceding read operation for the second word line group 1330 by the offset. The read retry voltage having the changed read voltage level is applied to the second word line group 1330. Alternately, the second register 1306 checks the corresponding RRT value through the level value and changes the read voltage level of the second word line group 1330 depending on the RRT value in the RRT for the second word line group 1330. The second register 1306 changes the read voltage level of the second word line group 1330 to a read voltage level corresponding to the RRT value in the RRT. The read retry voltage having the changed read voltage level is applied to the second word line group 1330.

That is, the second register 1306 receives the set parameter command and changes the read voltage level of the second word line group 1330 to a third read voltage level Vg3, and a third read retry voltage having the third read voltage level Vg3 is applied to the second word line group 1330. The controller 130 performs, when the third read retry voltage is applied to the second word line group 1330, a read retry operation for the $k_{th}$ word line WLk for which the read fail has occurred in the second word line group 1330, properly reads the read data stored in the $k_{th}$ word line WLk through the read retry operation, and then provides it to the host 102.

In this way, in the memory system in accordance with the present embodiment, each of the memory blocks of the memory device 150 is divided into a plurality of word line groups. In order to perform a read retry operation for word lines for which read fails have occurred, the read voltage levels for word line groups having the word lines are changed through registers that correspond to the word line groups, and read retry voltages having the changed read voltage levels are applied to the corresponding word line groups, thus performing the read retry operation for the word lines for which the read fails have occurred.

Furthermore, in an embodiment, as described above, the respective read voltage levels of the word line groups may be changed through a single register corresponding to the word line groups. Hereinafter, there will be described in detail an example of the case where the memory device 150 or the zeroth die 1200 includes a single register for the word line groups 1310, 1320, 1330, and 1340, for example, where the respective read voltage levels of the word line groups 1310, 1320, and 1330 including word lines for which read falls have occurred are changed through the single register.

That is, the controller 130 transmits a set parameter command to the zeroth block 1210 so as to perform a read retry operation for the word lines WL0, WL50, and WLk for which the read fails have occurred. The set parameter command is transmitted to the single register for the word lines WL0, WL50, and WLk for which the read fails have occurred in the zeroth block 1210.

As described above, the set parameter command includes information indicating the starting of the read retry operation for the word lines WL0, WL50, and WLk, for which the read falls have occurred, using RRTs, for example, information indicating starting to change read voltage levels using the RRTs for the word line groups 1310, 1320, and 1330 which includes the word lines WL0, WL50, and WLk. In addition, the set parameter command may include information indicating the single register corresponding to the word line groups 1310, 1320, and 1330 in which there is the need to change the read voltage levels using the RRTs, and information indicating the word line groups 1310, 1320, and 1330 corresponding to the single register. Furthermore, the set parameter command may include a level value for changing the read voltage levels of the word line groups 1310, 1320, and 1330 using the RRTs. In this regard, the set parameter command may include a level value corresponding to the read voltage levels of the word line groups 1310, 1320, and 1330 determined by the controller 130, that is, a level value corresponding to offsets or RRT values of the read voltage levels for the word line groups 1310, 1320, and 1330.

The single register changes the read voltage levels of the word line groups 1310, 1320, and 1330 depending on the level value included in the set parameter command, and read retry voltages having the changed read voltage levels are applied to the corresponding word line groups 1310, 1320, and 1330.

For example, the single register checks the read voltage level determined by the controller 130 through the level value, and successively changes the read voltage levels of the word line groups 1310, 1320, and 1330 depending on the level value. The read retry voltages having the changed read voltage levels are applied to the word line groups 1310, 1320, and 1330.

In an embodiment, the single register checks the offsets through the level value, and successively changes the read voltage levels of the word line groups 1310, 1320, and 1330 depending on the offsets. For example, the single register successively changes, by the offsets, the read voltage levels of all the word line groups from the zeroth word line group 1310 to the third word line group 1340 in the zeroth block 1210. The read retry voltages having the changed read voltage levels are applied to the word line groups 1310, 1320, 1330, and 1340. Alternatively, the single register may check, through an word line group indicator included in the set parameter command, among all of the word line groups 1310, 1320, 1330, and 1340 included in the zeroth block 1210, the word line groups 1310, 1320, and 1330 including the word lines WL0, WL50, and WLk for which the read fails have occurred, and then change the read voltage levels only for the word line groups 1310, 1320, and 1330.

In another embodiment, the single register checks the RRT values through the level value, and successively changes the read voltage levels of the word line groups 1310, 1320, and 1330 depending on the RRT values in the RRTs for the respective word line groups 1310, 1320, and 1330. For example, the single register successively changes the read voltage levels of all the word line groups from the zeroth word line group 1310 to the third word line group 1340 the zeroth block 1210 to read voltage levels corresponding to the RRT values. The read retry voltages having the changed read voltage levels are applied to the word line groups 1310, 1320, 1330, and 1340. Alternatively, the single register may check, through an word line group indicator included in the set parameter command, among all of the word line groups 1310, 1320, 1330, and 1340 included in the zeroth block 1210, the word line groups 1310, 1320, and 1330 including the word lines WL0, WL50, and WLk for which the read fails have occurred, and then change the read voltage levels only for the word line groups 1310, 1320, and 1330.

That is, the single register receives the set parameter command and changes the respective read voltage levels of the word line groups 1310, 1320, and 1330. Read retry voltages having the changed read voltage levels are applied to the respective word line groups 1310, 1320, and 1330. The controller 130 performs, when the read retry voltages are applied to the word line groups 1310, 1320, and 1330, a read retry operation for the word lines WL0, WL50, and WLk for which the read fails have occurred in the word line groups 1310, 1320, and 1330, properly reads the read data stored in the word lines WL0, WL50, and WLk through the read retry operation, and then provides it to the host 102.

In this way, in the memory system in accordance with the present embodiment, each of the memory blocks of the memory device 150 is divided into a plurality of word line groups. In order to perform a read retry operation for word lines for which read fails have occurred, the read voltage levels for the respective word line groups are changed through the single register, and read retry voltages having the changed read voltage levels are applied to the corresponding word line groups, thus performing the read retry operation for the word lines for which the read fails have occurred. Hereinafter, an operation of processing data in the memory system in accordance with an embodiment will be described in detail with reference to FIG. 15.

Figure 15:
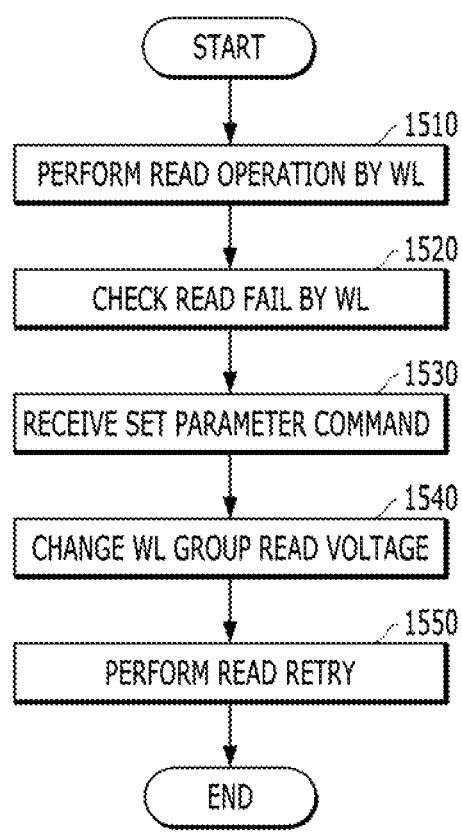
FIG. 15 is a flowchart of an operating process of a memory system, according to an embodiment of the invention.

FIG. 15 is a diagram schematically illustrating an operating process of processing data in a memory system in accordance with an embodiment.

Referring to FIG. 15, at step 1510, the memory system 110 reads, from the memory blocks of the memory device 150, read data corresponding to a read command received from the host 102. The memory system 110 performs a read operation for each of word lines included in the memory blocks and reads the read data stored in the memory blocks, and then provides the read data to the host 102.

At step 1520, during the read operation, read fails in the memory blocks are checked, in detail, read falls are checked for each of the word lines included in the memory blocks a.

Subsequently, at step 1530, a set command, for example, a set parameter command, for performing a read retry operation corresponding to the read fails in the memory blocks is received.

At step 1540, information included in the set parameter command is checked, and read voltage levels for the respective word line groups included in each memory block are changed. In other words, through the single register or the plurality of registers corresponding to the respective word line groups of the memory block, the read voltage levels for word line groups including word lines for which the read fails have occurred are changed. Respective read retry voltages corresponding to the word line groups including the word lines for which the read fails have occurred are applied to the word line groups.

At step 1550, as the respective read retry voltages corresponding to the word line groups of the memory block are applied, a read retry operation for the word lines for which the read fails have occurred in the word line groups is performed, and the read data stored in the word lines for which the read fails have occurred is properly read through the read retry operation and then provided to the host 102.

The data read operation for the memory blocks of the memory device, in particular, the read retry operation for the case where read fails have occurred in word lines included in the memory blocks, and the operation of changing, for performing the read retry operation, the read voltage levels for the respective word line groups including the word lines for which the read fails have occurred and applying the read retry voltages to the respective word line groups have been described in detail with reference to FIGS. 12 to 14; and therefore, detailed explanation thereof will be omitted.

As described above, a memory system and an operating method thereof are provided for minimizing the complexity and performance deterioration of the memory system. The memory system and the operating method thereof may more rapidly and reliably process data to and or from a memory device included in the memory system. More specifically, according to an embodiment, the memory system groups word lines into groups and sets and manages a read retry table for each group of the word lines, thereby minimizing transmission of the set command and enhancing read operation performance. According to an embodiment, when a read operation fails, the controller of the memory system transmits a set command to set and manage a read retry table for a word line group which contains a word line for which the read operation failed, thereby increasing a read voltage and performing a read retry operation.

Although various embodiments have been described for illustrative purposes, it will be apparent to those skilled in the art that various changes and modifications may be made without departing from the spirit and/or scope of the invention as defined in the following claims.

What is claimed is:

1. A memory system comprising:
   a memory device including a plurality of memory blocks, each memory block including a plurality of word lines, each word line being coupled to a plurality of memory cells; and
   a controller suitable for grouping the word lines into a plurality of word line groups,
   wherein when receiving a read command for data stored in a first memory block, the controller performs a read operation for word lines of the first memory block, checks for read fail word lines in the word lines of the first memory block, checks for word line groups including the read fail word lines, and transmits a set command corresponding to the read fail word lines to the word line groups which contain read fail word lines,
   wherein the set command includes information indicating a register corresponding to the word line groups of the first memory block,
   wherein a read voltage level for the word line groups of the first memory block is successively changed to a plurality of levels through the register depending on an offset or a read retry table (RRT) value that is included in the set command, and
   wherein read retry voltages having the plurality of levels are applied to the word line groups of the first memory block.

2. The memory system according to claim 1, wherein the set command includes:
   first information indicating a first register corresponding to a first word line group in which a first read fail word line of the read fail word lines is included; and
   second information indicating a second register corresponding to a second word line group in which a second read fail word line of the read fail word lines is included.

3. The memory system according to claim 2,
   wherein a read voltage level of the first word line group is changed to a first level through the first register depending on a level value included in the set command,
   wherein a read voltage level of the second word line group is changed to a second level through the second register depending on the level value included in the set command,
   wherein a first read retry voltage having the first level is applied to the first word line group, and
   wherein a second read retry voltage having the second level is applied to the second word line group.

4. The memory system according to claim 3,
   wherein the controller determines each of the first level and the second level, and
   wherein the level value is determined corresponding to the first level and the second level each of which is determined by the controller.

5. The memory system according to claim 3, wherein the level value is determined by an offset for the read voltage level of the first word line group and the read voltage level of the second word line group, or by a table value from a read retry table (RRT) corresponding to the first word line group and the second word line group.

6. The memory system according to claim 3, wherein the controller performs, through the first read retry voltage applied to the first word line group and the second read retry voltage applied to the second word line group, a read retry operation for the first read fail word line and the second read fail word line.

7. The memory system according to claim 1,
    wherein the set command includes indication information on the word line groups including the read fail word lines, and
    wherein corresponding to the indication information, a read voltage level of the word line groups including the read fail word lines is changed to the plurality of levels through the register.

8. The memory system according to claim 1, wherein the word line groups of the first memory block are included in word line groups of a second memory block of the memory blocks.

9. A method of operating a memory system comprising a memory device with a plurality of memory blocks, comprising:
    grouping a plurality of word lines included in the plurality of memory blocks, and dividing each of the memory blocks into a plurality of word line groups, wherein each of the memory blocks includes a plurality of pages each including a plurality of memory cells coupled to respective word lines;
    receiving a read command for data stored in a first memory block of the memory blocks;
    performing a read operation for word lines of the first memory block;
    checking read fail word lines in the word lines of the first memory block, and checking, in word line groups of the first memory block, word line groups including the read fail word lines;
    transmitting a set command corresponding to the read fail word lines to the first memory block;
    successively changing a read voltage level for the word line groups of the first memory block to a plurality of levels through a register depending on an offset or a read retry table (RRT) value that is included in the set command; and
    applying read retry voltages having the plurality of levels to the word line groups of the first memory block,
    wherein the set command includes information indicating the register corresponding to the word line groups of the first memory block.

10. The method according to claim 9, wherein the set command includes:
    first information indicating a first register corresponding to a first word line group in which a first read fail word line of the read fail word lines is included; and
    second information indicating a second register corresponding to a second word line group in which a second read fail word line of the read fail word lines is included.

11. The method according to claim 10, further comprising:
    changing a read voltage level of the first word line group to a first level through the first register depending on a level value included in the set command;
    changing a read voltage level of the second word line group to a second level through the second register depending on the level value included in the set command;
    applying a first read retry voltage having the first level to the first word line group; and
    applying a second read retry voltage having the second level to the second word line group.

12. The method according to claim 11, wherein each of the first level and the second level is determined by a controller of the memory device, and the level value is determined corresponding to the first level and the second level each of which is determined by the controller.

13. The method according to claim 11, wherein the level value is determined by an offset for the read voltage level of the first word line group and the read voltage level of the second word line group, or by a table value from a read retry table (RRT) corresponding to the first word line group and the second word line group.

14. The method according to claim 11, further comprising:
    performing, through the first read retry voltage applied to the first word line group and the second read retry voltage applied to the second word line group, a read retry operation for the first read fail word line and the second read fail word line.

15. The method according to claim 9, wherein the successively changing comprises:
    changing, when indication information on the word line groups including the read fail word lines is included in the set command, corresponding to the indication information, a read voltage level of the word line groups including the read fail word lines to the plurality of levels through the register.

16. The method according to claim 9, wherein the word line groups of the first memory block are included in word line groups of a second memory block of the memory blocks.

* * * * *